(12) United States Patent
Lu et al.

(10) Patent No.: US 12,501,792 B2
(45) Date of Patent: Dec. 16, 2025

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventors: Jiangnan Lu, Beijing (CN); Libin Liu, Beijing (CN); Guangliang Shang, Beijing (CN); Long Han, Beijing (CN); Yu Feng, Beijing (CN); Li Wang, Beijing (CN); Mei Li, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 504 days.

(21) Appl. No.: 17/923,934

(22) PCT Filed: Nov. 4, 2021

(86) PCT No.: PCT/CN2021/128615
§ 371 (c)(1),
(2) Date: Nov. 8, 2022

(87) PCT Pub. No.: WO2022/170792
PCT Pub. Date: Aug. 18, 2022

(65) Prior Publication Data
US 2023/0180551 A1    Jun. 8, 2023

(30) Foreign Application Priority Data
Feb. 9, 2021  (CN) .......................... 202110179988.2

(51) Int. Cl.
*H10K 59/131*  (2023.01)
*H10K 59/12*   (2023.01)
*H10K 59/124*  (2023.01)

(52) U.S. Cl.
CPC ....... *H10K 59/131* (2023.02); *H10K 59/1201* (2023.02); *H10K 59/124* (2023.02)

(58) Field of Classification Search
CPC . H10K 59/131; H10K 59/1201; H10K 59/124
See application file for complete search history.

(56) References Cited

U.S. PATENT DOCUMENTS

2009/0231325 A1* 9/2009 Suzuki ..................... G09G 3/20
                                                       345/55
2015/0294987 A1   10/2015 Xia et al.
(Continued)

FOREIGN PATENT DOCUMENTS

CN    107527894 A    12/2017
CN    108493226 A     9/2018
(Continued)

OTHER PUBLICATIONS

Office Action issued on Nov. 15, 2024, in corresponding Chinese patent Application No. 202110179988.2, 17 pages.

*Primary Examiner* — Jay C Kim
*Assistant Examiner* — Woo K Lee
(74) *Attorney, Agent, or Firm* — XSENSUS LLP

(57) ABSTRACT

A display panel includes: a substrate; at least one first signal line disposed on the substrate and located in a peripheral region; at least one second signal line disposed on the substrate and located in the peripheral region; an insulating layer covering the at least one first signal line and the at least one second signal line; and a shielding signal line covering the at least one groove. The at least one second signal line and the at least one first signal line are arranged in a same layer. A surface of the insulating layer away from the substrate has at least one groove. An orthogonal projection, on the substrate, of a bottom surface of a groove is located (Continued)

between orthogonal projections, on the substrate, of a first signal line and a second signal line.

17 Claims, 15 Drawing Sheets

(56) References Cited

U.S. PATENT DOCUMENTS

| | | |
|---|---|---|
| 2018/0074361 A1 | 3/2018 | Chung et al. |
| 2018/0158895 A1 | 6/2018 | Lee et al. |
| 2018/0337226 A1 | 11/2018 | Liu et al. |
| 2019/0051668 A1* | 2/2019 | Huang ............... H10D 86/60 |
| 2019/0252413 A1 | 8/2019 | Xu et al. |

FOREIGN PATENT DOCUMENTS

| | | |
|---|---|---|
| CN | 112864179 A | 5/2021 |
| CN | 113035066 A | 6/2021 |
| CN | 214542235 U | 10/2021 |
| KR | 2019-0042860 A | 4/2019 |
| WO | 2020/077948 A1 | 4/2020 |

* cited by examiner

DISPLAY PANEL AND METHOD FOR MANUFACTURING THE SAME, AND DISPLAY DEVICE

CROSS-REFERENCE TO RELATED APPLICATIONS

This application is a national phase entry under 35 USC 371 of International Patent Application No. PCT/CN2021/128615, filed on Nov. 4, 2021, which claims priority to Chinese Patent Application No. 202110179988.2, filed on Feb. 9, 2021, which are incorporated herein by reference in their entirety.

TECHNICAL FIELD

The present disclosure relates to the field of display technologies, and in particular, to a display panel and a method for manufacturing the same, and a display device.

BACKGROUND

With the advancement of display technologies, the requirements for user experience are getting higher and higher. In addition, with the increase in the possession of display products, people also put forward higher requirements for display quality.

SUMMARY

In an aspect, a display panel is provided. The display panel has a display region and a peripheral region located on at least one side of the display region. The display panel includes a substrate, at least one first signal line, at least one second signal line, an insulating layer and a shielding signal line. The at least one first signal line is disposed on the substrate and located in the peripheral region. The at least one second signal line is disposed on the substrate and located in the peripheral region. The at least one second signal line and the at least one first signal line are arranged in a same layer. The insulating layer covers the at least one first signal line and the at least one second signal line. A surface of the insulating layer away from the substrate has at least one groove. An orthogonal projection, on the substrate, of a bottom surface of a groove of the at least one groove is located between orthogonal projections, on the substrate, of a first signal line of the at least one first signal line and a second signal line of the at least one second signal line. The shielding signal line covers the at least one groove.

In some embodiments, in a direction perpendicular to a plane where the substrate is located, the bottom surface of the groove is closer to the substrate than at least one of a top surface of the first signal line and a top surface of the second signal line.

In some embodiments, the first signal line is adjacent to the second signal line. A width of the orthogonal projection, on the substrate, of the bottom surface of the groove is less than or equal to a distance between adjacent two edges of the orthogonal projections, on the substrate, of the first signal line and the second signal line.

In some embodiments, a width of the orthogonal projection, on the substrate, of the bottom surface of the groove is in a range of 2 µm to 10 µm, inclusive.

In some embodiments, the first signal line and the second signal line extends in a same direction. The groove extends in an extending direction of the first signal line and the second signal line.

In some embodiments, the orthogonal projections, on the substrate, of the first signal line and the second signal line are located within an orthogonal projection, on the substrate, of the shielding signal line.

In some embodiments, the shielding signal line is located in the peripheral region, and surrounds the display region.

In some embodiments, the first signal line is configured to transmit a first signal. The second signal line is configured to transmit a second signal. The first signal and the second signal are pulse signals, and the first signal and the second signal are different. The shielding signal line is configured to transmit a direct current signal.

In some embodiments, the first signal and the second signal have a same pulse cycle. The first signal and the second signal have a phase difference.

In some embodiments, the pulse cycle is in a range of 4 µs to 100 µs, inclusive.

In some embodiments, the display panel further includes a plurality of light-emitting devices. The plurality of light-emitting devices are disposed on the substrate and located in the display region. Each light-emitting device of the plurality of light-emitting devices includes a first electrode and a second electrode. The first electrode is closer to the substrate than the second electrode. The second electrode is coupled to the shielding signal line.

In some embodiments, the first electrode of the light-emitting device and the shielding signal line are arranged in a same layer. The insulating layer has a double-layer structure.

In some embodiments, the first electrode of the light-emitting device is farther away from the substrate than the shielding signal line. The insulating layer has a single-layer structure.

In some embodiments, the display panel further includes a plurality of pixel circuits and a driving circuit. The plurality of pixel circuits are disposed on the substrate and located in the display region. The driving circuit is disposed on the substrate and located in the peripheral region. The driving circuit is coupled to the plurality of pixel circuits, the first signal line and the second signal line. The driving circuit is configured to provide driving signals to the plurality of pixel circuits in response to a first signal received at the first signal line and a second signal received at the second signal line, so as to drive the plurality of pixel circuits to operate.

In another aspect, a display device is provided. The display device includes the display panel as described in any of the above embodiments and a control chip. The control chip is coupled to the display panel. The control chip is configured to provide signals for the display panel.

In yet another aspect, a method for manufacturing a display panel is provided. The method includes: providing a substrate, the substrate having a display region and a peripheral region located on at least one side of the display region; forming at least one first signal line and at least one second signal line on the substrate and in the peripheral region; forming an insulating layer, the insulating layer covering the at least one first signal line and the at least one second signal line, a surface of the insulating layer away from the substrate having at least one groove, and an orthogonal projection, on the substrate, of a bottom surface of a groove of the at least one groove being located between orthogonal projections, on the substrate, of a first signal line of the at least one first signal line and a second signal line of the at least one second signal line; and forming a shielding signal line, the shielding signal line covering the at least one groove.

In some embodiments, forming the insulating layer includes: forming an insulating material layer on the substrate on which the at least one first signal line and the at least one second signal line have been formed; forming a photoresist layer on the insulating material layer, exposing the photoresist layer through a halftone mask, and developing the exposed photoresist layer, so as to obtain a photoresist completely-removed portion, at least one photoresist partially-retained portion and a photoresist completely-retained portion; etching the insulating material layer, so as to remove a portion of the insulating material layer corresponding to the photoresist completely-removed portion; removing the at least one photoresist partially-retained portion through an ashing process; etching a respective portion of the insulating material layer corresponding to each of the at least one photoresist partially-retained portion, so as to obtain the at least one groove; and stripping the photoresist completely-retained portion, so as to obtain the insulating layer.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
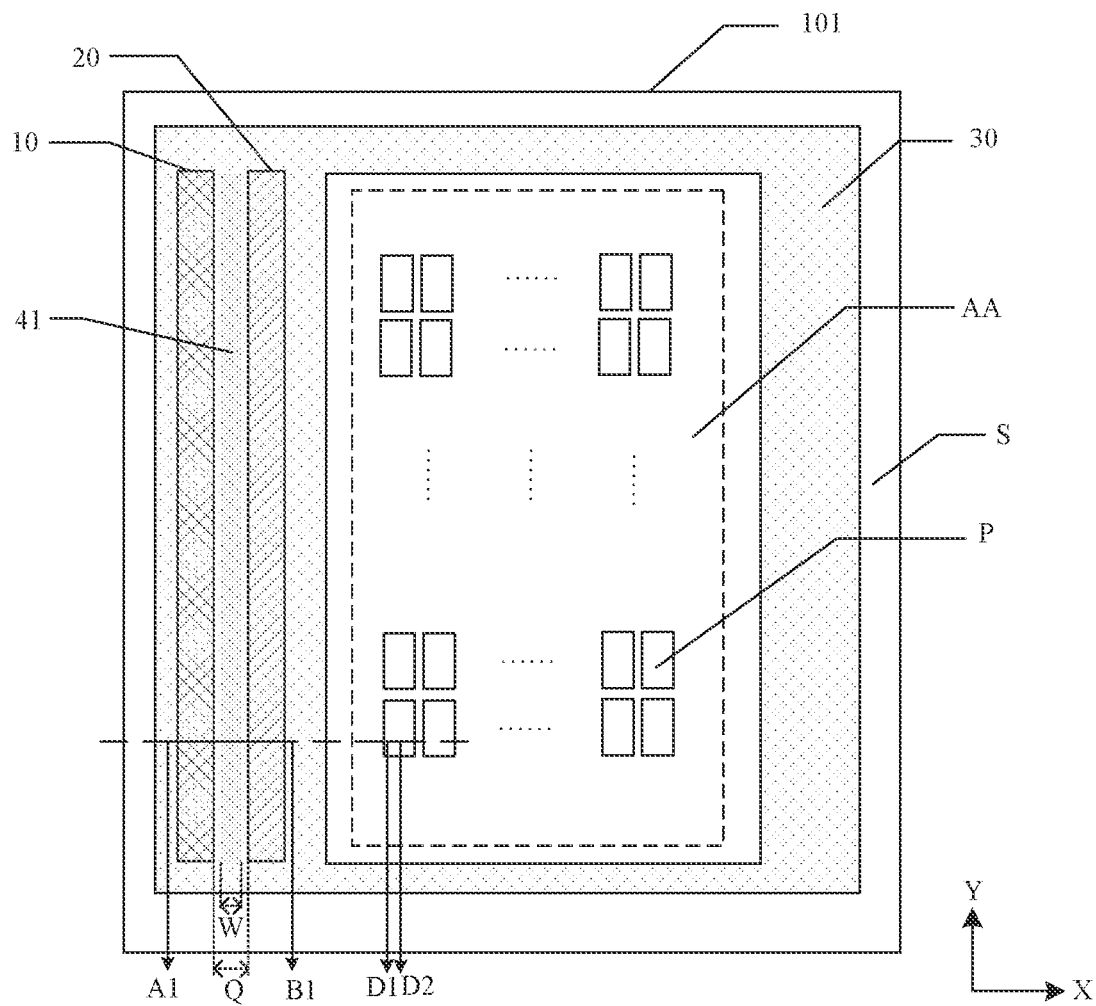
FIG. 1 is a schematic diagram showing a structure of a display panel, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled", "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

The phase "suitable for" or "configured to" as used herein indicates an open and inclusive expression, which does not exclude devices that are applicable to or configured to perform additional tasks or steps.

As used herein, the term "about" or "approximately" includes a stated value and an average value within an acceptable deviation range of a specific value. The acceptable deviation range is determined by a person of ordinary skill in consideration of the measurement in question and errors associated with the measurement of a particular quantity (i.e., limitations of the measurement system). Exemplary embodiments are described herein with reference to sectional views and/or plan views as idealized exemplary drawings. In the accompanying drawings, the thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

In a display panel, for example, due to a limitation of a wiring space, a distance between two adjacent signal lines is relatively small. During the signal transmission process of signal lines in the display panel, signals transmitted on the two adjacent signal lines are prone to crosstalk, which reduces a stability of the signals and affects a normal operation of some circuits in the display panel. Therefore, the display effect is reduced.

Some embodiments of the present disclosure provide a display panel. As shown in FIG. 1, the display panel 100 has a display region AA and a peripheral region S. For example, the peripheral region S is located on at least one side of the display region AA. For example, referring to FIG. 1, the display region AA is a region defined by a dotted box. The peripheral region S may surround the display region AA.

For example, the display panel 100 includes a plurality of sub-pixels P disposed in the display region AA. For example, the plurality of sub-pixels P are arranged in an array. For example, sub-pixels P arranged in a line in a first direction X in FIG. 1 are referred to as a same row of sub-pixels, and sub-pixels P arranged in a line in a second direction Y in FIG. 1 are referred to as a same column of sub-pixels. For example, each pixel includes sub-pixels of the plurality of sub-pixels; the plurality of sub-pixels include sub-pixels of a first color, sub-pixels of a second color, and sub-pixels of a third color. For example, the first color, the second color and the third color are three primary colors; for example, the first color, the second color and the third color are blue, green and red, respectively. That is, the plurality of sub-pixels include red sub-pixels, green sub-pixels and blue sub-pixels.

It will be noted that, in the embodiments of the present disclosure, a three-dimensional Cartesian coordinate system is established based on a substrate of the display panel. In the three-dimensional Cartesian coordinate system, the first direction X and the second direction Y are parallel to a plane where the substrate is located, and a third direction Z (e.g., as shown in FIG. 2) is perpendicular to the plane where the substrate is located.

Figure 2:
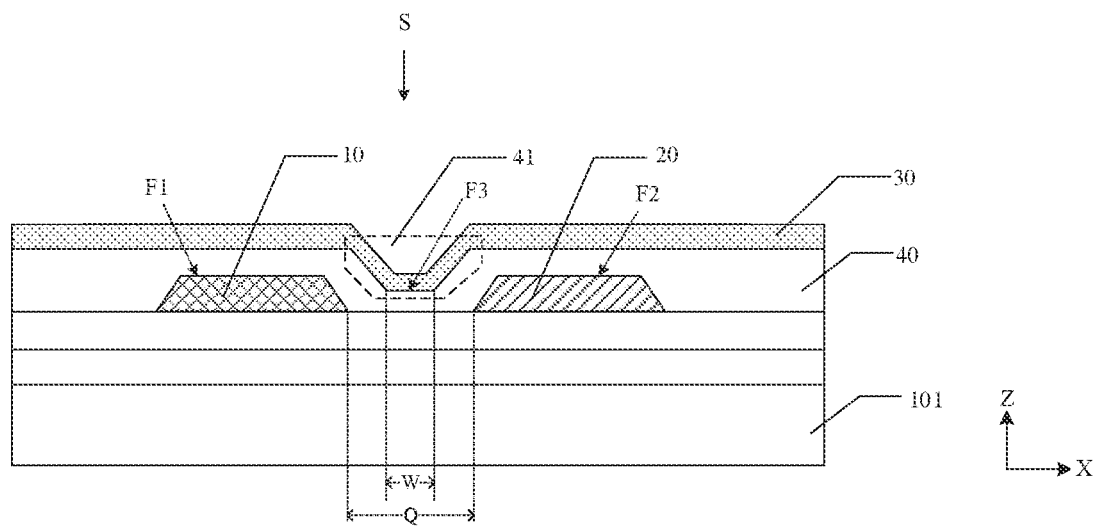
FIG. 2 is a sectional view of the display panel in FIG. 1 taken along the A1-B1 direction.

For example, referring to FIGS. 1 and 2, the display panel 100 includes the substrate 101, at least one first signal line 10, at least one second signal line 20, and an insulating layer 40. The at least one first signal line 10, the at least one second signal line 20, a shielding signal line 30 and the insulating layer 40 are all disposed on the substrate 101. The at least one first signal line 10 and the at least one second signal line 20 are located in the peripheral region S. The insulating layer 40 covers the at least one first signal line 10 and the at least one second signal line 20; that is, the insulating layer 40 is disposed on a side of the at least one first signal line 10 and the at least one second signal line 20 away from the substrate 101; that is, the insulating layer 40 is disposed on the at least one first signal line 10 and the at least one second signal line 20.

For example, the substrate 101 is a rigid substrate such as a glass substrate, or a flexible substrate such as a polyimide (PI) substrate; the rigid substrate or the flexible substrate is provided with a buffer layer and other layers therein.

For example, the at least one first signal line and the at least one second signal line are arranged in a same layer. For example, a layer where the first signal line(s) and the second signal line(s) are located is regarded as a first conductive layer. For example, the first signal line(s) and the second signal line(s) are made of a same material. For example, the material of the first signal line(s) and the second signal line(s) may include a metal, such as molybdenum (Mo), aluminum (Al), or copper (Cu). For example, the first signal line(s) and the second signal line(s) may be formed synchronously. For example, the first signal line(s) and the second signal line(s) are formed by patterning a same film layer. In this way, it may be possible to reduce the production processes and simplify the process. For example, a first signal line is adjacent to a second signal line. For example, in the layer where the first signal line and the second signal line are located, there is no signal line between the first signal line and the second signal line.

Figure 6:
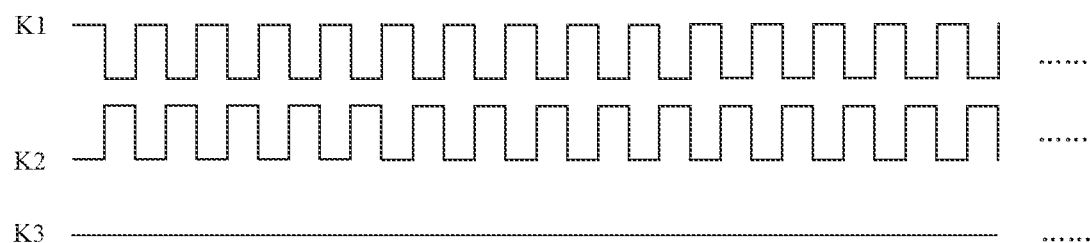
FIG. 6 is a timing diagram of a first signal, a second signal and a direct current signal, in accordance with some embodiments.

The first signal line is configured to transmit a first signal. The second signal line is configured to transmit a second signal. The first signal and the second signal are pulse signals, and the first signal and the second signal are different. For example, referring to FIG. 6, the first signal K1 and the second signal K2 have a same pulse cycle, and the first signal and the second signal have a phase difference. A pulse cycle refers to a duration from a rising edge (or a falling edge) of a pulse of a pulse signal (e.g., the first signal or the second signal) to a rising edge (or a falling edge) of a next pulse next to the pulse of the pulse signal. For example, a rising edge (or a falling edge) of a pulse of the first signal and a rising edge (or a falling edge) of a pulse of the second signal are not at a same time; for example, an interval duration between the rising edge (or the falling edge) of the pulse of the first signal and the rising edge (or the falling edge) of the pulse of the second signal is greater than 0 and less than the pulse cycle. For example, the phase difference between the first signal and the second signal is half of the pulse cycle. For example, the first signal and the second signal are alternating current (AC) signals; for example, the first signal and the second signal are clock signals, and the first signal and the second signal have a same clock cycle. For example, the phase difference between the first signal and the second signal is equal to half of the pulse cycle; for example, the first signal and the second signal are inverted signals.

For example, the first signal and the second signal are high-frequency signals. For example, the pulse cycle of the first signal is in a range of 4 μs to 100 μs, inclusive; and the pulse cycle of the second signal is in a range of 4 μs to 100 μs, inclusive. For example, the pulse cycle of the first signal is 4 μs, 5 μs, 10 μs, 25 μs, 50 μs, 80 μs or 100 μs; the pulse cycle of the second signal is 4 μs, 5 μs, 10 μs, 25 μs, 50 μs, 80 μs or 100 μs. For example, a frequency of the first signal is in a range of 10,000 Hz to 250,000 Hz, inclusive; and a frequency of the second signal is in a range of 10,000 Hz to 250,000 Hz, inclusive. For example, the frequency of the first signal is 10,000 Hz, 12,500 Hz, 20,000 Hz, 40,000 Hz, 100,000 Hz, 200,000 Hz or 250,000 Hz; the frequency of the second signal is 10,000 Hz, 12,500 Hz, 20,000 Hz, 40,000 Hz, 100,000 Hz, 200,000 Hz or 250,000 Hz.

In this case, referring to FIG. 2, a surface of the insulating layer 40 away from the substrate 101 has at least one groove 41. An orthogonal projection, on the substrate 101, of a bottom surface F3 of a groove 41 (i.e., a surface of the groove 41 proximate to the substrate 101) is located between orthogonal projections, on the substrate 101, of a first signal line 10 and a second signal line 20. For example, the first signal line 10 is adjacent to the second signal line 20. For example, a depth direction of the at least one groove 41 (e.g., the third direction Z in FIG. 2) is perpendicular to the substrate 101. For example, a portion of the surface of the insulating layer away from the substrate corresponding to a space between the first signal line and the second signal line is depressed toward the substrate in the direction perpendicular to the substrate, so as to obtain the groove. For example, a depth of the groove is less than a thickness of the insulating layer. For example, the bottom surface and a side wall of the groove are formed by the insulating layer.

Referring to FIGS. 1 and 2, the display panel 100 further includes the shielding signal line 30. The shielding signal line 30 covers the groove(s) 41. For example, the shielding signal line 30 is disposed on a side of the insulating layer 40 away from the substrate 101. For example, the shielding signal line covers the bottom surface and the side wall of the groove.

For example, the shielding signal line is configured to transmit a direct current (DC) signal. For example, referring to FIG. 6, an amplitude of a voltage (or current) of the DC signal K3 remains constant or approximately constant (e.g., the amplitude varies within a small value range). For example, the DC signal may be a DC low voltage. For example, the shielding signal line may be a power supply voltage line, and the power supply voltage line is configured to transmit a low-level power supply voltage.

In this case, since the first signal transmitted on the first signal line and the second signal transmitted on the second signal line are different and change frequently with time, the first signal and the second signal are prone to crosstalk during the transmission process, which reduces the stability of the signals and affects the normal operation of some circuits in the display panel. Since the DC signal transmitted on the shielding signal line in the groove remains constant or approximately constant, the first signal line and the second signal line may be shielded, which may avoid the signal crosstalk between the first signal line and the second signal line. In addition, a thickness of a portion of the insulating layer at the groove is small, and a portion of the shielding signal line is located in the groove. Therefore, the thickness of layers of the display panel may not be increased, which is conducive to realizing the light weight and small thickness of the display panel.

Therefore, in the display panel provided in the embodiments of the present disclosure, the at least one first signal line and the at least one second signal line are covered by the insulating layer, and at least one groove is provided on the insulating layer. A position of a single groove corresponds to a position between a single first signal line and a single second signal line that are adjacent, and the shielding signal line covers the at least one groove. In this way, the shielding signal line shields the first signal line and the second signal line, which avoids the signal crosstalk between the first signal line and the second signal line. In addition, the thickness of the portion of the insulating layer at the groove is small, and the portion of the shielding signal line is located in the groove. Therefore, the thickness of layers of the display panel may not be increased, which is conducive to realizing the light weight and small thickness of the display panel.

In some embodiments, referring to FIG. 2, in the direction perpendicular to the plane where the substrate 101 is located (e.g., in the third direction Z), the bottom surface of the groove 41 is closer to the substrate 101 than at least one of a top surface F1 of the first signal line 10 and a top surface F2 of the second signal line 20. That is, the surface F3 of the groove 41 proximate to the substrate 101 is closer to the substrate 101 than both the surface F1 of the first signal line 10 away from the substrate 101 and the surface F2 of the second signal line 20 away from the substrate 101. For example, an orthogonal projection, on a first plane, of the shielding signal line may overlap with an orthogonal projection, on the first plane, of a side wall of the first signal line proximate to the second signal line, the first plane being perpendicular to a direction that is parallel to the plane where the substrate is located and perpendicular to an extending direction of the first signal line; an orthogonal projection, on a second plane, of the shielding signal line may overlap with an orthogonal projection, on the second plane, of a side wall of the second signal line proximate to the first signal line, the second plane being perpendicular to a direction that is parallel to the plane where the substrate is located and perpendicular to an extending direction of the second signal line. In this way, it may be possible to extend a shielding range of the shielding signal line to the first signal line and the second signal line, and in turn improve the shielding effect of the shielding signal line to the first signal line and the second signal line, and avoid the signal interference between the first signal line and the second signal line.

In some embodiments, referring to FIGS. 1 and 2, a width W of the orthogonal projection of the bottom surface of the groove 41 on the substrate 101 is less than or equal to a distance Q between adjacent two edges of the orthogonal projections, on the substrate 101, of the first signal line 10 and the second signal line 20. For example, a size of the orthogonal projection of the bottom surface of the groove on the substrate in a direction (e.g., the first direction X in FIG. 1) that is perpendicular to the extending direction of the first signal line or the second signal line and parallel to the plane where the substrate is located is the width of the orthogonal projection of the bottom surface of the groove on the substrate. In this way, the portion of the shielding signal line located in the groove may shield the first signal line and the second signal line, thereby avoiding the signal interference.

In some embodiments, referring to FIGS. 1 and 2, the width W of the orthogonal projection, on the substrate 101, of the surface of the groove 41 proximate to the substrate 101 is in a range of 2 μm to 10 μm, inclusive. For example, the width W may be 2 μm, 4 μm, 6 μm, 7 μm, 9 μm or 10 μm. For example, the width W may be in a range of 3 μm to 5 μm, inclusive.

In some embodiments, the orthogonal projections, on the substrate 101, of the first signal line 10 and the second signal line 20 are located within an orthogonal projection, on the substrate 101, of the shielding signal line 30. In this way, the shielding signal line may cover the groove, the first signal line and the second signal line, which may improve the shielding effect of the shielding signal line to the first signal line and the second signal line, and avoid the signal interference between the first signal line and the second signal line.

In some embodiments, referring to FIG. 1, the first signal line 10 and the second signal line 20 extend in the same direction. The groove 41 extends in the extending direction of the first signal line 10 and the second signal line 20. That is, the extending direction of the groove 41 is same as the extending direction of the first signal line 10 or the extending direction of the second signal line 20. For example, the groove 41, the first signal line 10 and the second signal line 20 extend in the first direction X in FIG. 1. For example, in the extending direction of the first signal line, a length of the groove is equal to or approximately equal to a length of the first signal line; or, in the extending direction of the second signal line, the length of the groove is equal to or approximately equal to a length of the second signal line. In this way, it may be possible to improve the shielding effect of the shielding signal line to the first signal line and the second signal line, and avoid the signal interference between the first signal line and the second signal line.

Figure 3:
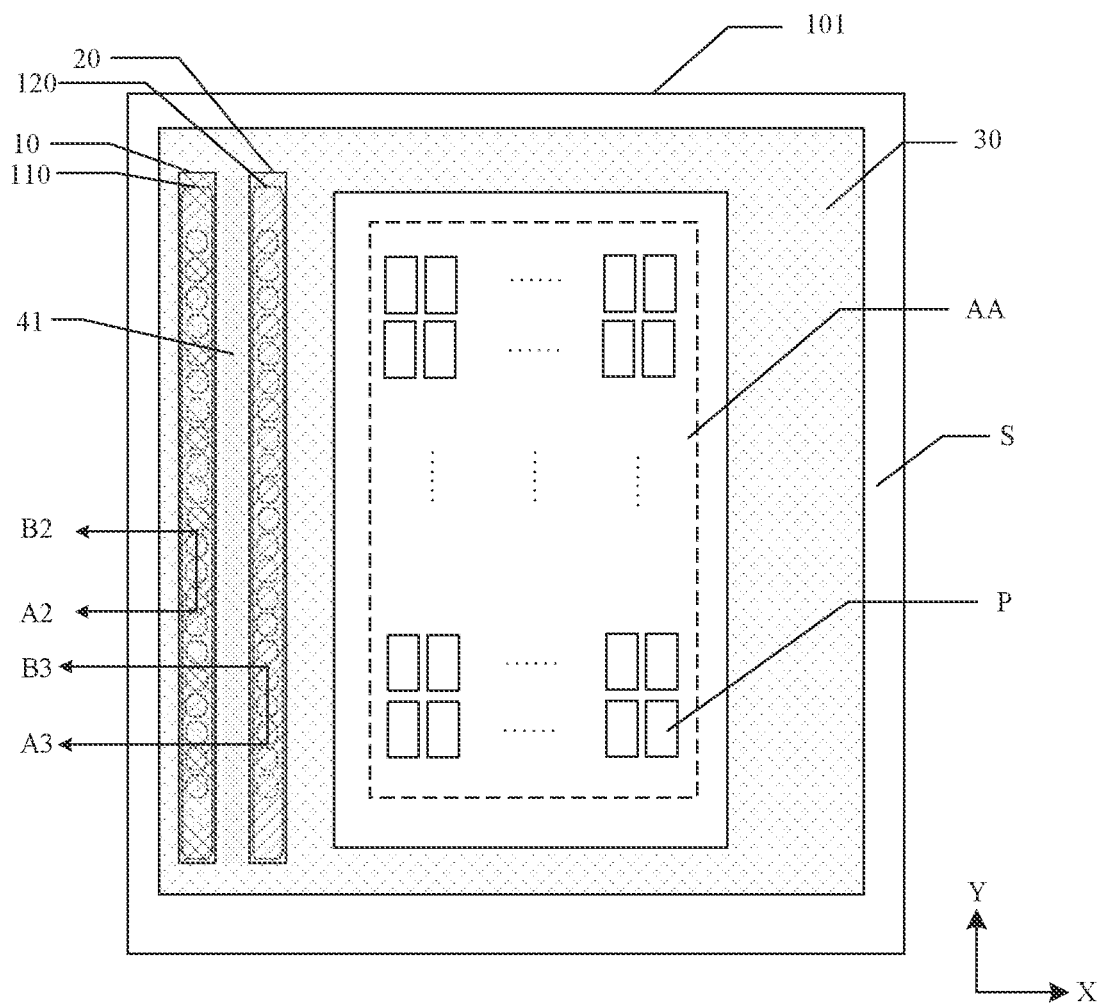
FIG. 3 is a schematic diagram showing a structure of another display panel, in accordance with some embodiments.
Figure 4:
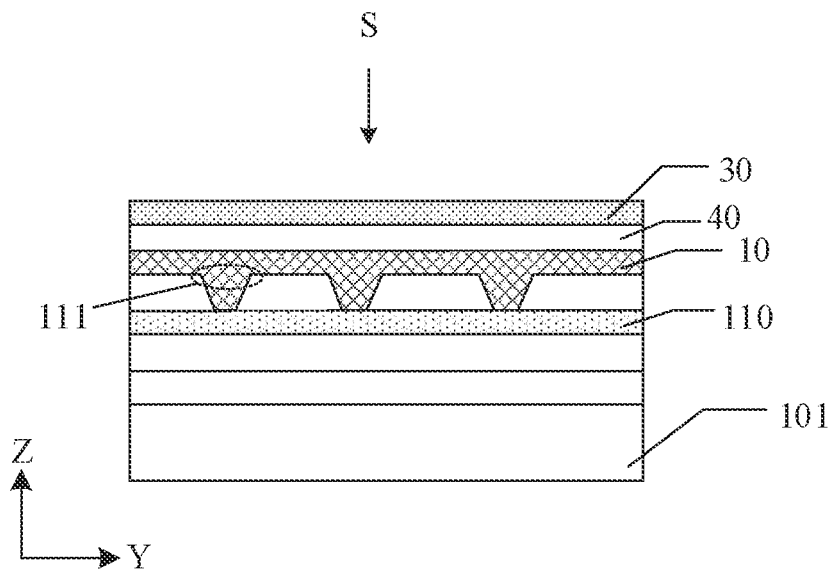
FIG. 4 is a sectional view of the display panel in FIG. 3 taken along the A2-B2 direction.

In some embodiments, referring to FIGS. 3 and 4, the display panel 100 further includes first conductive pattern(s) 110. The first conductive pattern(s) 110 are disposed on the substrate 101, and are located on a side of the first signal line(s) 10 proximate to the substrate 101. An orthogonal projection of the first conductive pattern 110 on the substrate 101 overlaps with the orthogonal projection of the first signal line 10 on the substrate 101. The first conductive pattern 110 is coupled to the first signal line 10. For example, the first signal line 10 is in contact with the first conductive pattern 110 through a plurality of first via holes 111 (e.g., at least two first via holes) provided in a layer located between the layer where the first signal line 10 is located and a layer where the first conductive pattern 110 is located. For example, the first conductive pattern(s) and the first signal line(s) may be made of a same material. In this case, the first conductive pattern may be used to transmit the first signal. That is, the first signal is transmitted by the first signal line in the first conductive layer and the first conductive pattern in a second conductive layer. In this way, it may be possible to reduce the resistance of the first signal line, and reduce the loss of the signal transmitted on the first signal line, and in turn improve the effect of signal transmission. In addition, in the extending direction of the first signal line, two adjacent first via holes may be communicated with each other.

Figure 5:
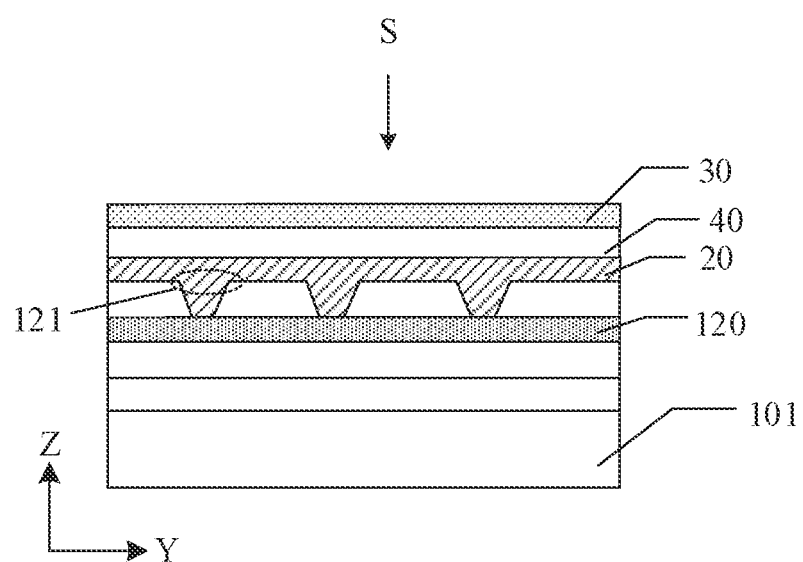
FIG. 5 is a sectional view of the display panel in FIG. 3 taken along the A3-B3 direction.

In some embodiments, referring to FIGS. 3 and 5, the display panel 100 further includes second conductive pattern(s) 120. The second conductive pattern(s) 120 are disposed on the substrate 101, and are located on a side of the second signal line(s) 20 proximate to the substrate 101. An orthogonal projection of the second conductive pattern 120 on the substrate 101 overlaps with the orthogonal projection of the second signal line on the substrate 101. The second conductive pattern 120 is coupled to the second signal line 20. For example, the second signal line 20 is in contact with the second conductive pattern 120 through a plurality of second via holes 121 (e.g., at least two second via holes) provided in a layer located between the layer where the second signal line 20 is located and a layer where the second conductive pattern 120 is located. For example, the second conductive pattern and the second signal line may be made of a same material. In this case, the second conductive pattern is used to transmit the second signal. That is, the second signal is transmitted by the second signal line in the first conductive layer and the second conductive pattern in the second conductive layer. In this way, it may be possible to reduce the resistance of the second signal line, and the loss of the signal transmitted on the second signal line, and in turn improve the effect of signal transmission. In addition, in the extending direction of the second signal line, two adjacent second via holes may be communicated with each other.

In some embodiments, the first conductive pattern(s) and the second conductive pattern(s) are arranged in the same layer. For example, the layer where the first conductive pattern(s) and the second conductive pattern(s) are located may be regarded as the second conductive layer. The first conductive pattern(s) and the second conductive pattern(s) are made of the same material. The material of the first conductive pattern(s) and the second conductive pattern(s) may include a metal, such as Mo, Al, or Cu. For example, the first conductive pattern(s) and the second conductive pattern(s) may be formed synchronously. For example, the first conductive pattern(s) and the second conductive pattern(s) are formed by patterning a same film layer. In this way, it may be possible to reduce the production processes and simplify the process.

Figure 7:
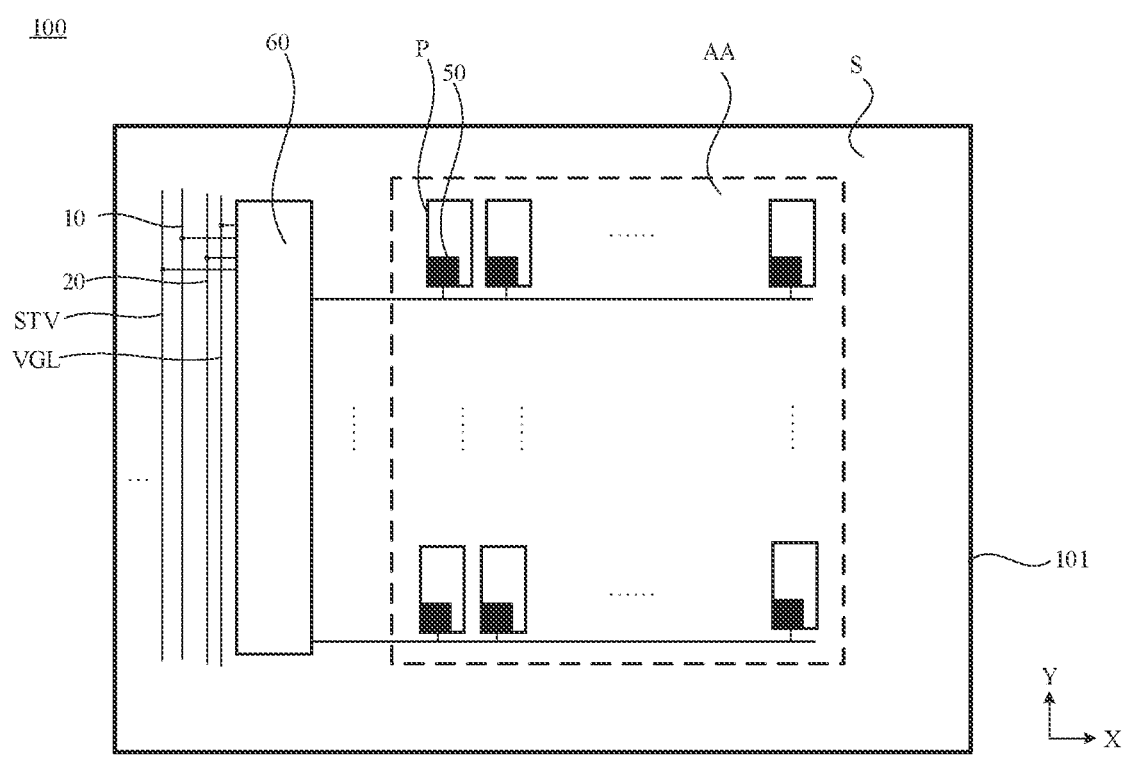
FIG. 7 is a schematic diagram showing a structure of yet another display panel, in accordance with some embodiments.

In some embodiments, referring to FIG. 7, the display panel 100 includes a plurality of pixel circuits 50. The plurality of pixel circuits 50 are disposed on the substrate 101 and located in the display region AA. For example, a sub-pixel P includes a pixel circuit 50. In some embodiments, the display panel further includes a plurality of light-emitting devices. The plurality of light-emitting devices are disposed on the substrate and located in the display region AA. A sub-pixel includes a light-emitting device. For example, a single pixel circuit is coupled to a single light-emitting device, and the pixel circuit is used to provide a driving current for the light-emitting device, so as to drive the light-emitting device to operate. For example, referring to FIG. 9, the display panel 100 further includes third conductive pattern(s) 130 disposed on a side of first electrodes 71 of the light-emitting devices 70 proximate to the substrate 101. The first electrode 71 of the light-emitting device 70 is coupled to the pixel circuit 50 through the third conductive pattern 130.

The specific structure of the pixel circuit is not limited in the embodiments of the present disclosure, which may be designed according to actual situations. The pixel circuit is composed of a thin film transistor (TFT), a capacitor (C) and other electronic devices. In some examples, the pixel circuit includes two TFTs (a switching transistor and a driving transistor) and one capacitor, which constitute a 2T1C structure. In some other examples, the pixel circuit includes more than two TFTs (a plurality of switching transistors and a driving transistor) and at least one capacitor. For example, referring to FIG. 8, the pixel circuit 50 includes one capacitor Cst and seven transistors (six switching transistors M1, M2, M3, M5, M6 and M7, and one driving transistor M4), which constitute a 7T1C structure. It will be noted that, only one transistor in the pixel circuit is shown in some drawings (such as FIG. 9), and the actual structure of the pixel circuit is not limited thereto.

Figure 8:
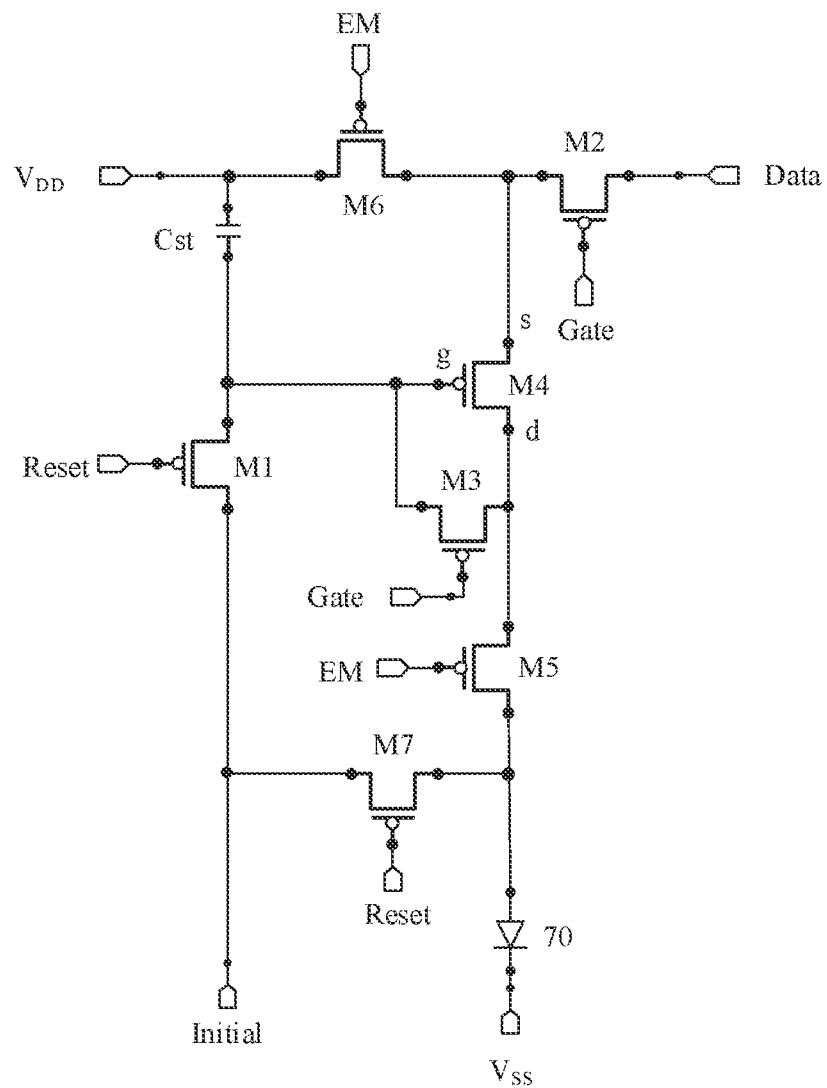
FIG. 8 is a circuit diagram of a pixel circuit, in accordance with some embodiments.

For example, as shown in FIG. 8, control electrodes (gates) of a part of the switching transistors (e.g., M1 and M7) are each used to receive a reset signal Reset. Control electrodes of another part of the switching transistors (e.g., M2 and M3) are each used to receive a gate driving signal Gate. Control electrodes of yet another part of the switching transistors (e.g., M5 and M6) are each used to receive a light-emitting control signal EM. For example, in the pixel circuit, the transistor M1 and the transistor M7 are each turned on in response to the reset signal Reset. The transistor M1 transmits the initial signal Initial to a control electrode g of the driving transistor M4, and the transistor M7 transmits the initial signal Initial to the light-emitting device 70, so as to reset the control electrode of the driving transistor M4 and the light-emitting device 70. The transistor M2 is turned on under control of the gate driving signal Gate; therefore, the control electrode g of the driving transistor M4 is coupled to a drain d of the driving transistor M4, and the driving transistor M4 is in a diode-conducting state. At this time, a data signal Data is written into a source s of the driving transistor M4 through the transistor M2, so as to compensate a threshold voltage Vth of the driving transistor M4. The transistor M5 and the transistor M6 are each turned on under control of the light-emitting control signal EM, and a current path between a high-level power supply voltage (e.g., a first power supply voltage $V_{DD}$) and a low-level power supply voltage (e.g., a second power supply voltage $V_{SS}$) is turned on. A driving current generated by the driving transistor M4 is transmitted to the light-emitting device 70 through the current path, so as to drive the light-emitting device 70 to emit light.

In some examples, the light-emitting device is a current-driven device; for example, the light-emitting device is a current-type light-emitting diode, such as a micro light-emitting diode (Micro LED), a mini light-emitting diode (Mini LED), an organic light-emitting diode (OLED), or a quantum light-emitting diode (QLED).

Figure 9:
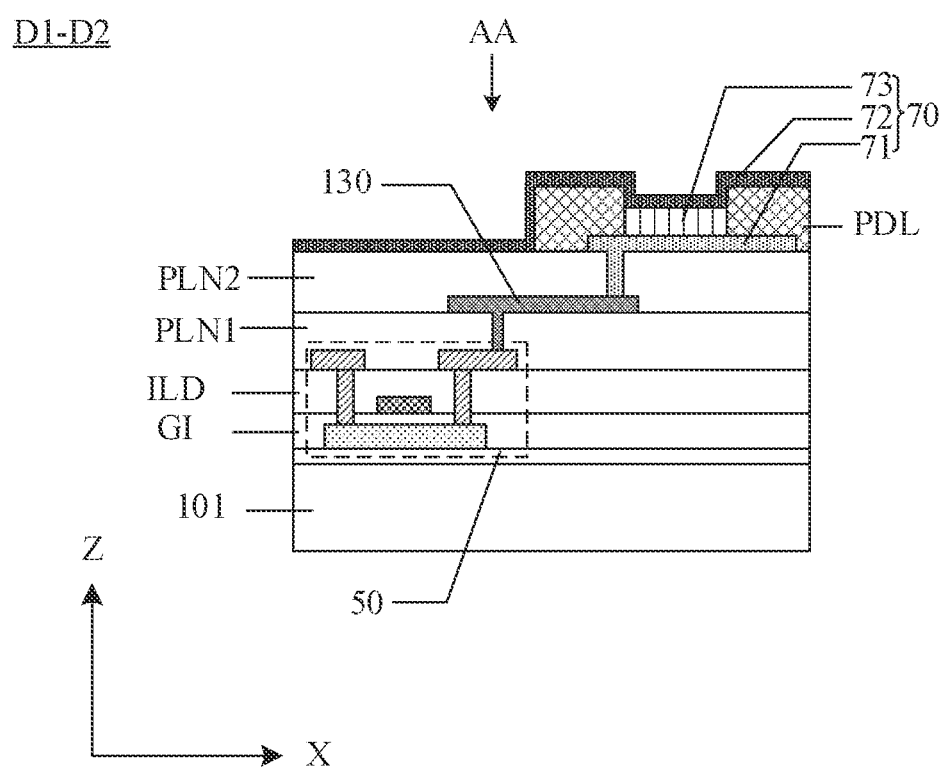
FIG. 9 is a sectional view of the display panel in FIG. 1 taken along the D1-D2 direction.

For example, referring to FIG. 9, each light-emitting device 70 includes a first electrode 71 and a second electrode 72. The first electrode 71 is closer to the substrate 101 than the second electrode 72. For example, the first electrode and the second electrode are an anode and a cathode, respectively. For example, referring to FIG. 9, the light-emitting device 70 further includes a light-emitting functional layer 73 located between the second electrode 72 and the first electrode 71. The light-emitting functional layer includes, for example, a light-emitting layer, a hole transporting layer (HTL) located between the light-emitting layer and the first electrode, and an electron transporting layer (ETL) located between the light-emitting layer and the second electrode. Of course, in some embodiments, a hole injection layer (HIL) may be provided between the HTL and the first electrode, and an electron injection layer (EIL) may be provided between the ETL and the second electrode, according to actual needs.

In some examples, the first electrode may be made of, for example, a transparent conductive material with a high work function, and the electrode material of the first electrode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), and carbon nanotubes. For example, the second electrode may be made of a material with a high conductivity and low work function, and the electrode material of the second electrode may include a magnesium aluminum alloy (MgAl), a lithium aluminum alloy (LiAl) and other alloys, or magnesium (Mg), aluminum (Al), lithium (Li), silver (Ag) and other pure metals. The material of the light-emitting layer may be selected according to the color of the emitted light. For example, the material of the light-emitting layer includes a fluorescent light-emitting material or a phosphorescent light-emitting material. For example, in some embodiments of the present disclosure, the light-emitting layer involves a doping process, that is, adding a doping material into a host light-emitting material to obtain a usable light-emitting material. For example, the host light-emitting material may be a metal compound material, a derivative of anthracene, an aromatic diamine compound, a triphenylamine compound, an aromatic triamine compound, a derivative of biphenyldiamine, or a triarylamine polymer, etc.

For example, referring to FIG. 9, the display panel 100 further includes a pixel defining layer PDL. The pixel defining layer may be used to define regions where the sub-pixels are located. For example, the pixel defining layer may be used to define positions where the light-emitting functional layers of the light-emitting devices 70 are formed. For example, the light-emitting functional layer 73 is located in an opening of the pixel defining layer PDL.

Figure 10A:
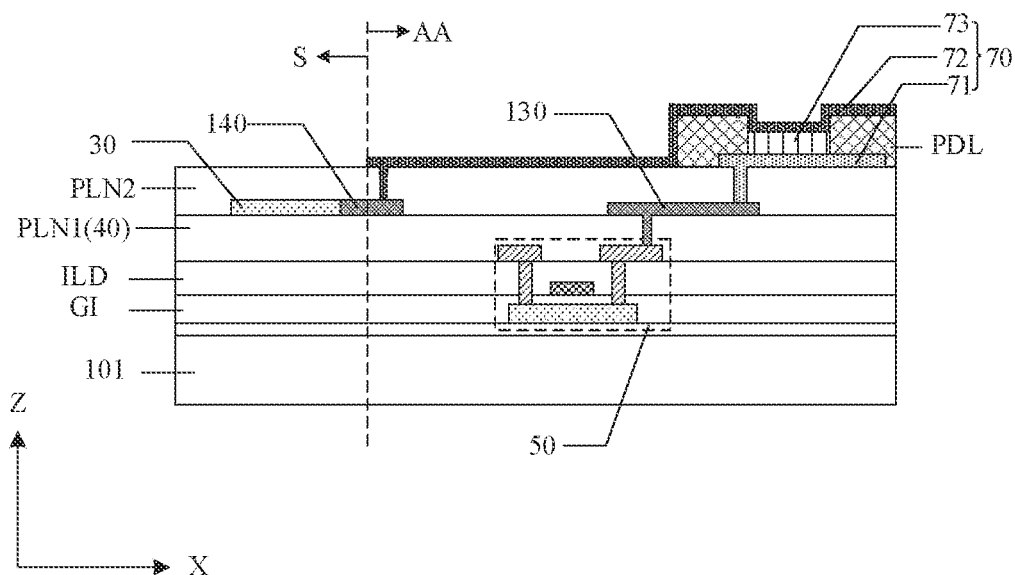
FIG. 10A is a schematic diagram showing a structure of yet another display panel, in accordance with some embodiments.
Figure 10B:
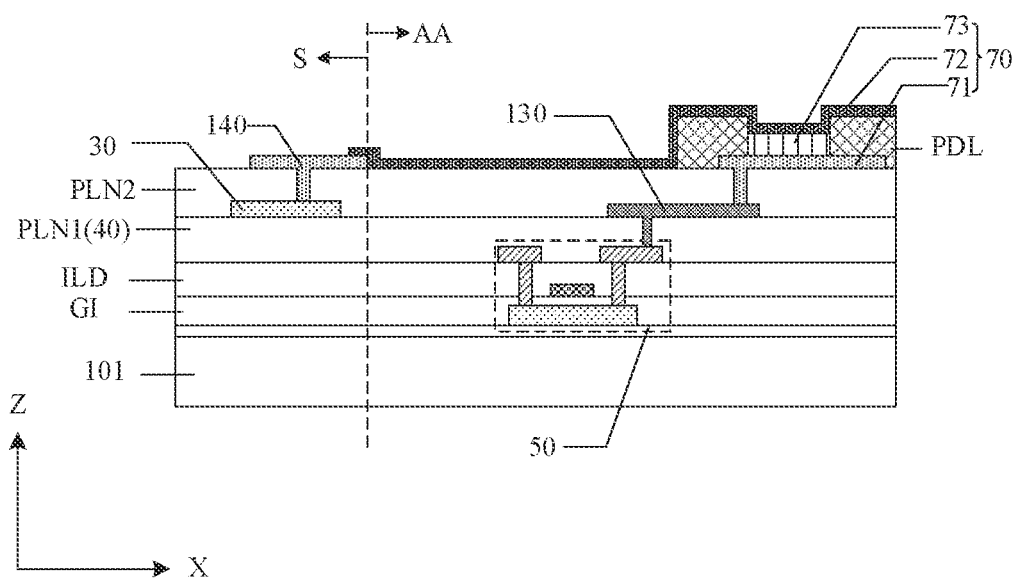
FIG. 10B is a schematic diagram showing a structure of yet another display panel, in accordance with some embodiments.

Second electrodes of the light-emitting devices are coupled to the shielding signal line. For example, referring to FIGS. 10A and 10B, the display panel 100 further includes fourth conductive pattern(s) 140. The fourth conductive pattern 140 is closer to the substrate 101 than the second electrode 72, the second electrode 72 is coupled to the fourth conductive pattern 140, and the fourth conductive pattern 140 is coupled to the shielding signal line 30. For example, referring to FIG. 10A, the fourth conductive pattern 140 and the shielding signal line 30 are arranged in a same layer; alternatively, referring to FIG. 10B, the fourth conductive pattern 140 and the first electrode 71 are arranged in a same layer, and the fourth conductive pattern 140 and the first electrode 71 are made of a same material. It will be noted that, FIGS. 10A and 10B are merely schematic diagrams, and the specific structure and connection manner may be designed according to actual situations. The second electrode receives the DC signal from the shielding signal line, and the DC signal is a DC low voltage.

In some embodiments, referring to FIG. 1, the shielding signal line 30 is located in the peripheral region S and surround the display region AA. The second electrodes of the plurality of light-emitting devices in the display region AA may be coupled to the shielding signal line, and may each receive the DC signal (e.g., the DC low voltage) transmitted from the shielding signal line, so as to reduce the impedance. For example, the second electrodes cover the display region AA; the second electrodes covering the display region AA may be formed through an evaporation process.

In some embodiments, as shown in FIG. 7, the display panel 100 further includes driving circuit(s) 60. The driving circuit(s) 60 are disposed on the substrate 101 and located in the peripheral region S. The driving circuit 60 is coupled to the plurality of pixel circuits 50, a first signal line 10 and a second signal line 20.

The driving circuit is configured to provide driving signals to the plurality of pixel circuits in response to the first signal received at the first signal line and the second signal received at the second signal line, so as to drive the plurality of pixel circuits to operate. For example, the plurality of pixel circuits are arranged in an array, and the driving circuit is used to provide driving signals to all rows of pixel circuits row by row, so as to drive the plurality of pixel circuits to operate row by row. For example, the driving signals provided by the driving circuit may include gate scanning signals Gate or light-emitting control signals EM.

For example, the driving circuit includes a plurality of shift registers. For example, referring to FIGS. 11 and 12, the driving circuit 60 includes a plurality of shift registers SR (e.g., SR(1), SR(2), SR(3), SR(4) and so on). For example, the plurality of shift registers SR are connected in cascade. For example, an input terminal Iput of a first-stage shift register (e.g., a shift register SR(1) shown in FIG. 11) is coupled to an initial signal line (e.g., an initial signal line STV shown in FIG. 11), an output terminal Oput of the shift register SR(1) is coupled to an input terminal Iput of a shift register SR(2), an output terminal Oput of the shift register SR(2) is coupled to an input terminal Iput of a shift register SR(3), an output terminal Oput of the shift register SR(3) is coupled to an input terminal Iput of a shift register SR(4), and so on.

For example, a single shift register is coupled to a single row of pixel circuits, and the shift register is used to output a driving signal to the row of pixel circuits. For example, referring to FIG. 11, the driving signals output by the shift registers SR in the driving circuit 60 are the gate driving signals Gate. For example, the first-stage shift register SR(1) outputs a gate driving signal Gate(1), so as to drive a first row of pixel circuits to operate; the second-stage shift register SR(2) outputs a gate driving signal Gate(2), so as to drive a second row of pixel circuits to operate; the third-stage shift register SR(3) outputs a gate driving signal Gate(3), so as to drive a third row of pixel circuits to operate; the fourth-stage shift register SR(4) outputs a gate driving signal Gate(4), so as to drive a fourth row of pixel circuits to operate; and so on. For example, referring to FIG. 12, the driving signals output by the shift registers SR in the driving circuit 60 are the light-emitting control signals EM. For example, the first-stage shift register SR(1) outputs a light-emitting control signal EM(1), so as to drive the first row of pixel circuits to operate; the second-stage shift register SR(2) outputs a light-emitting control signal EM(2), so as to drive the second row of pixel circuits to operate; the third-stage shift register SR(3) outputs a light-emitting control signal EM(3), so as to drive the third row of pixel circuits to operate; the fourth-stage shift register SR(4) outputs a light-emitting control signal EM(4), so as to drive the fourth row of pixel circuits to operate; and so on.

In this case, there are a plurality of driving circuits. For example, the plurality of driving circuits include a first driving circuit and a second driving circuit. The first driving circuit is used to output the gate scanning signals, and the second driving circuit is used to output the light-emitting control signals. The at least one first signal line includes two first signal lines, the first driving circuit is coupled to one first signal line of the two first signal lines, and the second driving circuit is coupled to the other first signal line of the two first signal lines. First signals transmitted by the two first signal lines are different; for example, the first signals transmitted by the two first signal lines may be of a same type, and have different signal timings and different voltage amplitudes. Similarly, the at least one second signal line includes two second signal lines, the first driving circuit is coupled to one second signal line of the two second signal lines, and the second driving circuit is coupled to the other second signal line of the two second signal lines. The second signals transmitted by the two second signal lines are different; for example, the second signals transmitted by the two second signal lines may be of a same type, and have different signal timings and different voltage amplitudes.

Figure 11:
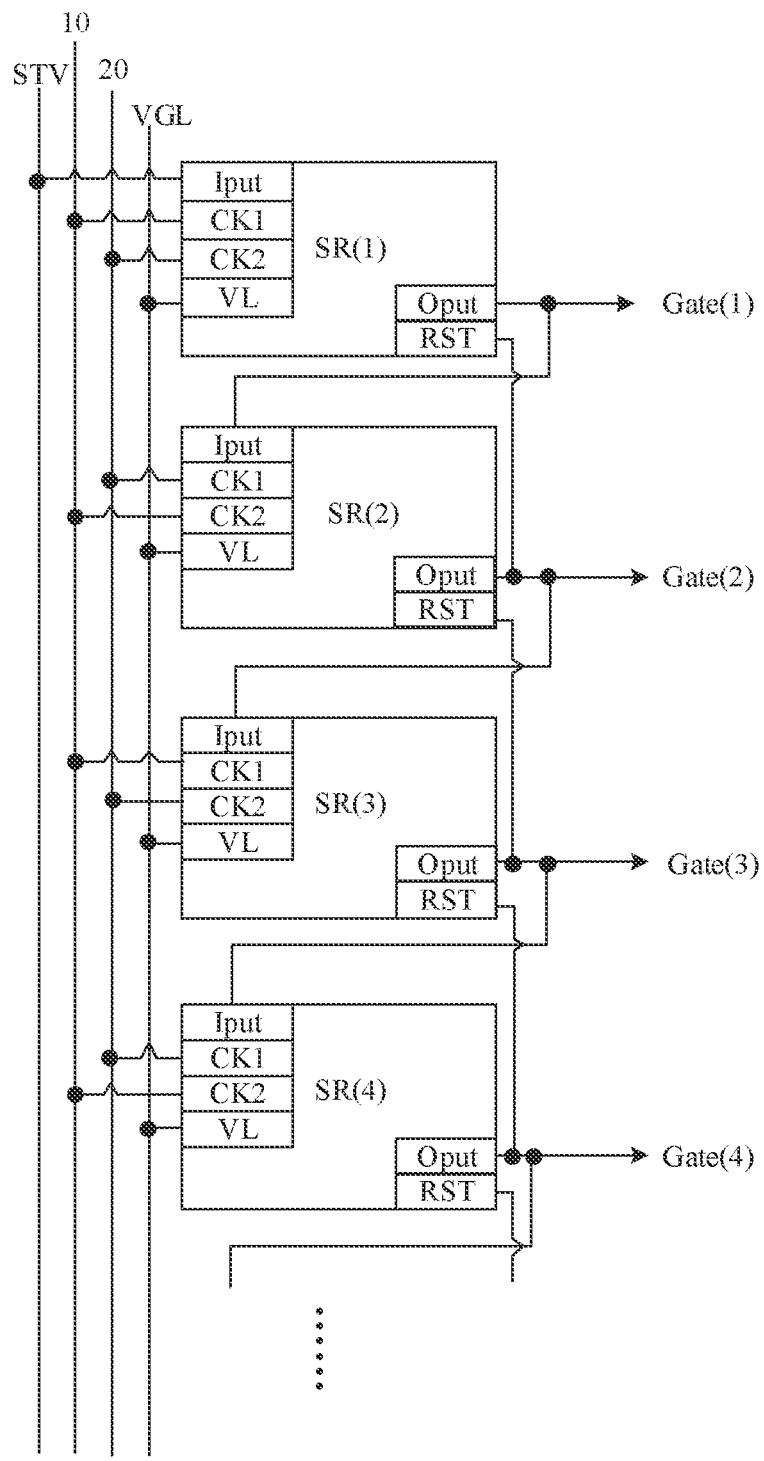
FIG. 11 is a schematic diagram showing a structure of a driving circuit, in accordance with some embodiments.
Figure 12:
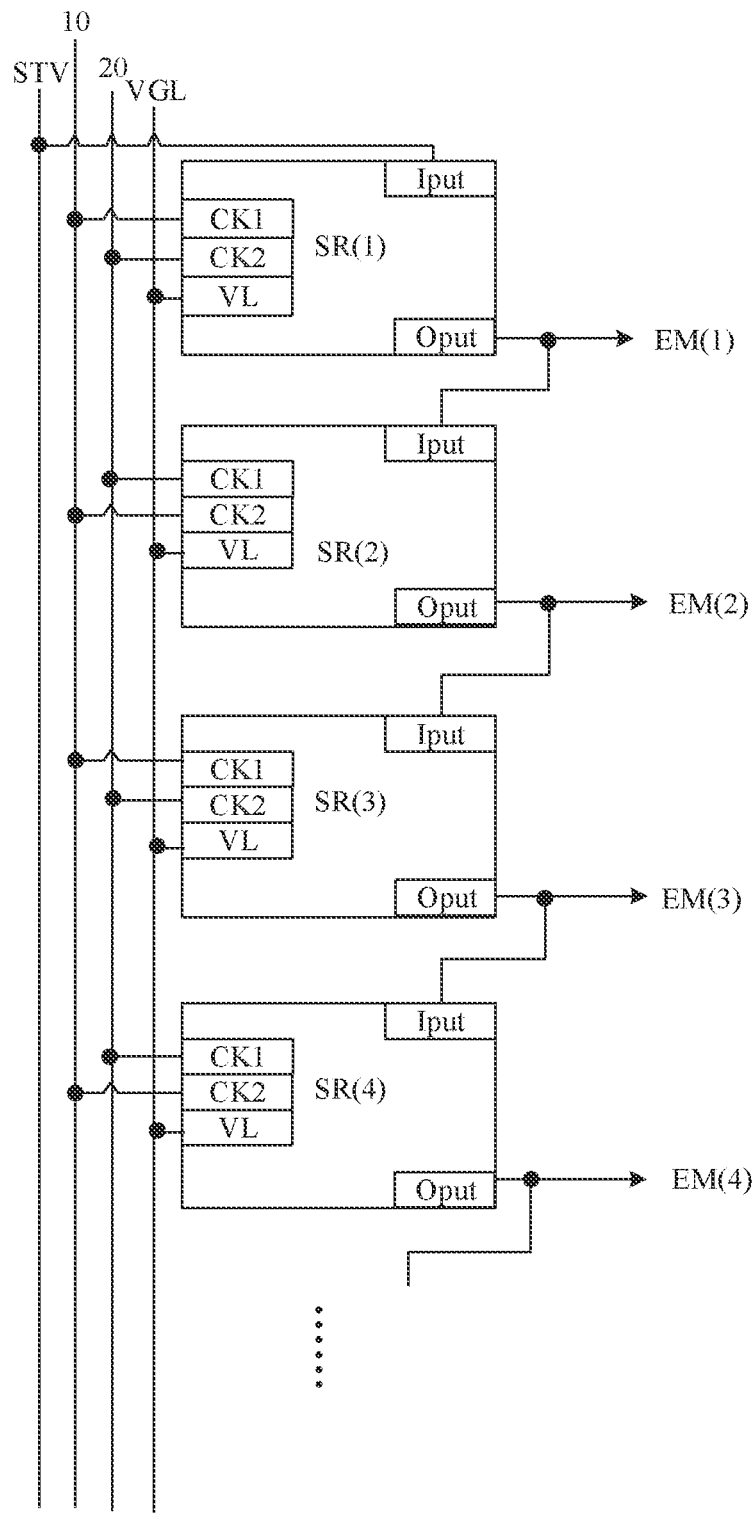
FIG. 12 is a schematic diagram showing a structure of another driving circuit, in accordance with some embodiments.
Figure 13:
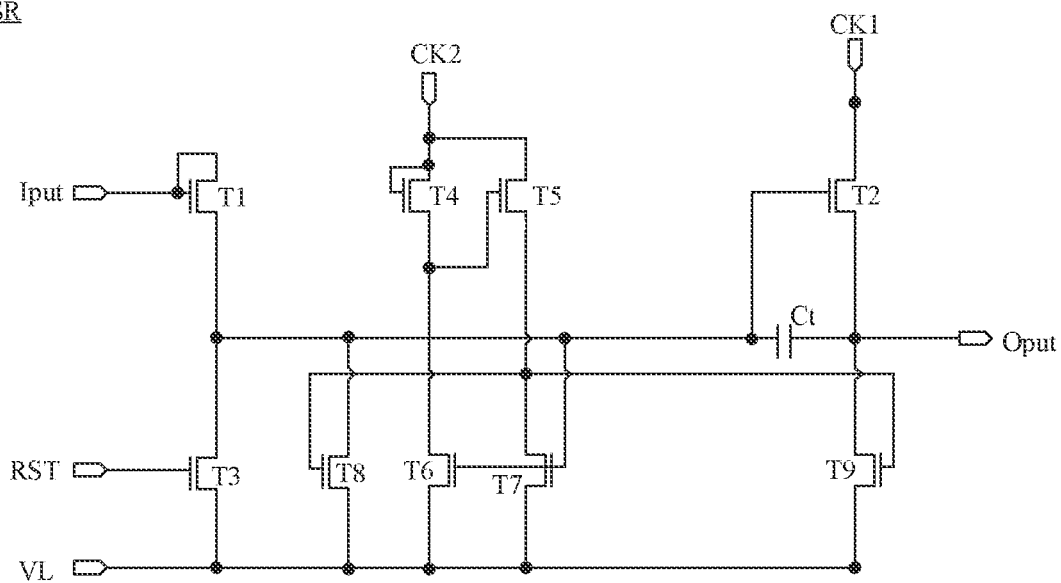
FIG. 13 is a circuit diagram of a shift register, in accordance with some embodiments.

For example, the specific structure of the driving circuit is not limited in the embodiments of the present disclosure, which may be designed according to actual situations. In addition, the specific structure of the shift register is not limited in the embodiments of the present disclosure, which may be designed according to actual situations. For example, the shift register is composed of a transistor, a capacitor and other electronic devices. For example, referring to FIG. 13, the shift register SR may include a plurality of transistors (e.g., T1, T2, T3, T4, T5, T6, T7, T8 and T9) and one capacitor (e.g., Ct). A control electrode and a first electrode of the transistor T1 are coupled to an input terminal Iput, a first electrode of the transistor T2 is coupled to a first clock signal terminal CK1, a second electrode of the transistor T2 is coupled to an output terminal Oput, a control electrode and a first electrode of the transistor T4 are coupled to a second clock signal terminal CK2, and a first electrode of the transistor T5 is coupled to the second clock signal terminal CK2. In addition, a control electrode of the transistor T3 is coupled to a noise reduction signal terminal RST, and the transistors T3, T6, T7, T8 and T9 are all coupled to a voltage terminal VL. For example, first clock signal terminals CK1 of odd-numbered-stage shift registers (e.g., the first-stage shift register SR(1) and the third-stage shift register SR(3) in FIG. 11) are coupled to the first signal line 10, so as to receive the first signal; and second clock signal terminals CK2 of the odd-numbered-stage shift registers are coupled to the second signal line 20, so as to receive the second signal. First clock signal terminals CK1 of even-numbered-stage shift registers (e.g., the second-stage shift register SR(2) and the fourth-stage shift register SR(4) in FIG. 11) are coupled to the second signal line 20, and second clock signal terminals CK2 of the even-numbered-stage shift registers are coupled to the first signal line 10. In this case, the first signal and the second signal are clock signals, and the first signal and the second signal are inverted signals. In addition, as shown in FIGS. 11 and 12, the voltage terminal VL is coupled to a voltage line VGL; for example, the voltage line VGL is used to transmit a DC low voltage signal.

For example, the driving manner of the display panel is not limited in the embodiments of the present disclosure, which may be designed according to actual situations. For example, as shown in FIG. 7, a single-sided driving manner is adopted. That is, a driving circuit 60 is disposed on a single side of the peripheral region S of the display panel 100, and the pixel circuits in the sub-pixels are driven row by row from the single side. For example, the display panel may adopt a double-sided simultaneous driving manner. That is, two driving circuits 60 are disposed on two sides of the peripheral region S of the display panel 100 in a row direction where the pixel circuits are arranged (or a row direction where the sub-pixels are arranged, e.g., the first direction X in FIG. 7), and the pixel circuits in the sub-pixels are driven row by row from the two sides through the two driving circuits 60 simultaneously. For example, the display panel 100 may adopt a double-sided alternate driving manner. That is, two driving circuits 60 are disposed on two sides of the peripheral region S of the display panel 100 in the row direction where the pixel circuits are arranged, and the pixel circuits in the sub-pixels are driven row by row from the two sides through the two driving circuits 60 alternately. In this case, the at least one first signal line includes a plurality of first signal lines, the at least one second signal line includes a plurality of second signal lines, and the plurality of first signal lines and the plurality of second signal lines are located on two opposite sides of the display region in the row direction where the pixel circuits are arranged.

Figure 14:
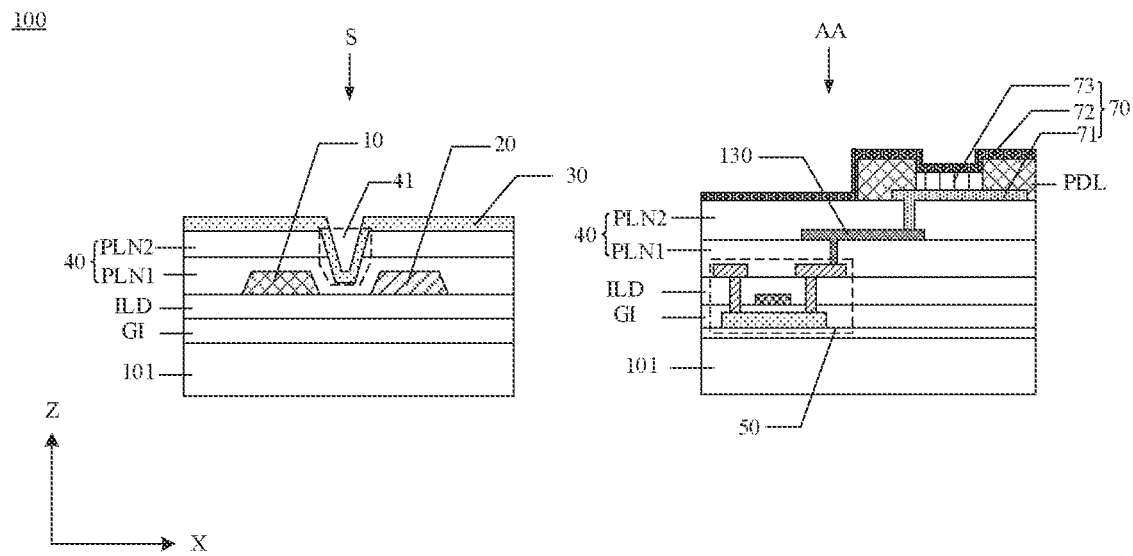
FIG. 14 is a schematic diagram showing a structure of yet another display panel, in accordance with some embodiments.

In some embodiments, as shown in FIG. 14, the first electrodes 71 of the light-emitting devices 70 and the shielding signal line 30 are arranged in a same layer. For example, the shielding signal line and the first electrodes are made of a same material. For example, the material of the shielding signal line may include a transparent conductive material, such as ITO. For example, the shielding signal line and the first electrodes may be formed by patterning a same film layer. In this way, it may be possible to reduce the production processes and save the cost. In addition, a layer provided between the shielding signal line and the second electrodes have a small thickness, which may facilitate the coupling of the second electrodes and the shielding signal line.

For example, the insulating layer has a double-layer structure; that is, the number of layers of the insulating layer is two. That is, the insulating layer, which is located between the layer where the first signal line(s) and the second signal line(s) are located and the layer where the shielding signal line is located, has two layers. For example, referring to FIG. 14, the insulating layer 40 with the double-layer structure includes a first insulating layer PLN1 and a second insulating layer PLN2. The first insulating layer PLN1 and the second insulating layer PLN2 are stacked in a direction perpendicular to the substrate 101, and the second insulating layer PLN2 is farther away from the substrate 101 than the first insulating layer PLN1. For example, the bottom surface of the groove is formed by the first insulating layer, and the side wall of the groove is formed by the second insulating layer and the first insulating layer. For example, in the direction perpendicular to the plane where the substrate is located, the groove penetrates the second insulating layer, and the depth of the groove is greater than a thickness of the second insulating layer and less than a thickness of the insulating layer (i.e., a total thickness of the first insulating layer and the second insulating layer).

Figure 15:
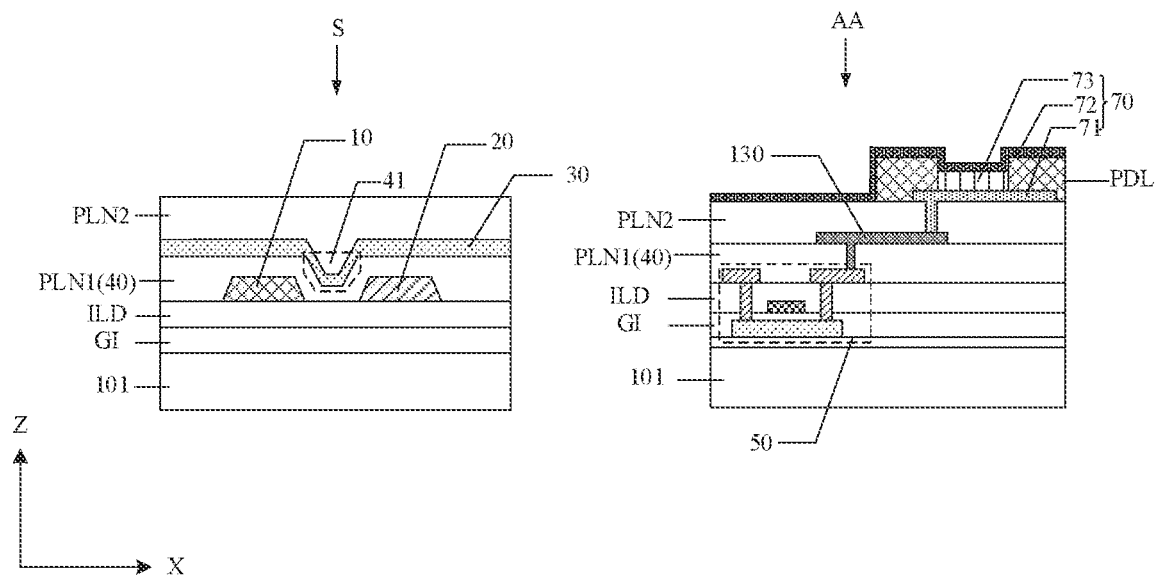
FIG. 15 is a schematic diagram showing a structure of yet another display panel, in accordance with some embodiments.

In some embodiments, as shown in FIG. 15, the first electrodes 71 of the light-emitting devices 70 are farther away from the substrate 101 than the shielding signal line 30. For example, the material of the shielding signal line includes a metal material. For example, the insulating layer has a single-layer structure; that is, the number of layers of the insulating layer is one. That is, the insulating layer, which is located between the layer where the first signal line(s) and the second signal line(s) are located and the layer where the shielding signal line is located, has one layer. For example, referring to FIG. 15, the insulating layer 40 with the single-layer structure may be regarded as a first insulating layer PLN1. In this case, the layer located between the layer where the first signal line(s) and the second signal line(s) are located and the layer where the shielding signal line is located has a small thickness, which may improve the shielding effect of the shielding signal line to the signal interference between the first signal line and the second signal line. In addition, in this case, a layer located between the layer where the first electrodes of the light-emitting devices are located and the layer where the shielding signal line is located may be regarded as a second insulating layer PLN2.

For example, in a case where the display panel does not include the first conductive pattern(s) and the second conductive pattern(s), the insulating layer located between the layer where the first signal line(s) and the second signal line(s) are located (e.g., the first conductive layer) and the layer where the shielding signal line is located may have a double-layer structure; for example, the double-layer structure includes the first insulating layer PLN1 and the second insulating layer PLN2. For another example, in a case where the display panel includes the first conductive pattern(s) and the second conductive pattern(s), the insulating layer located between the layer where the first signal line(s) and the second signal line(s) are located (e.g., the first conductive layer) and the layer where the shielding signal line is located may have a single-layer structure; for example, the single-layer structure includes a first insulating layer PLN1. A layer located between the layer where the first conductive pattern(s) and the second conductive pattern(s) are located (e.g., the second conductive layer) and the layer where the first signal line(s) and the second signal line(s) are located (e.g., the first conductive layer) may be an interlayer dielectric (ILD) layer; the layer located between the layer where the first electrodes of the light-emitting devices are located and the layer where the shielding signal line is located may be a second insulating layer PLN2.

In addition, for example, the transistor includes an active pattern (i.e., an active layer), a gate (e.g., a control electrode), a source and a drain. The display panel further includes a gate insulating layer GI located between the gate and the active pattern of the transistor. The source and the drain are located on a side of the gate away from the substrate, the source and the drain are arranged in a same layer, and the source and the drain are coupled to the active pattern. For example, there is an ILD layer between the gate and both the source and the drain. For example, the source, the drain, the first signal line and the second signal line are disposed in a same layer. Alternatively, a layer where the source and the drain are located is closer to the substrate than the layer where the first signal line and the second signal line are located. For example, a first insulating layer exists between the layer where the first signal line and the second signal line are located and the layer where the source and the drain are located.

For example, the types of the transistors are not limited in the embodiments of the present disclosure, which may be designed according to actual situations. For example, the transistor used in the embodiments of the present disclosure may be a P-type transistor or an N-type transistor, or may be a bottom-gate transistor or a top-gate transistor. The transistors used in the embodiments of the present disclosure may be TFTs, field effect transistors (FETs), or other switching devices with same properties, which is not limited in the embodiments of the present disclosure. For example, the transistor may be a metal oxide TFT (e.g., a TFT whose active pattern is made of indium gallium zinc oxide (IGZO)) and a low temperature polysilicon (P-Si) TFT (e.g., a TFT whose active pattern is made of P-Si). A control electrode of each transistor is a gate of the transistor, a first electrode of the transistor is one of a source and a drain of the transistor, and a second electrode of the transistor is another one of the source and the drain of the transistor. Since the source and the drain of the transistor may be symmetrical in structure, there may be no difference in structure between the source and the drain of the transistor. That is, the first electrode and the second electrode of the transistor in the embodiments of the present disclosure may be the same in structure.

Figure 16:
FIG. 16 is a block diagram showing a structure of a display device, in accordance with some embodiments.

Embodiments of the present disclosure provide a display device. The display device includes a display panel as described in any one of the above embodiments. For example, as shown in FIG. 16, the display device 200 further includes a control chip 300, and the control chip 300 is coupled to the display panel 100. For example, the control chip may include a timing controller (TCON). The control chip is configured to provide signals for the display panel. For example, the control chip provides a first signal for each of the at least one first signal line in the display panel, and provides a second signal for each of the at least one second signal line, and provides a DC signal to the shielding signal line.

In addition, the display device further includes a frame disposed around the display panel.

For example, the display device may be any device that displays images whether in motion (e.g., videos) or stationary (e.g., static images), and whether textual or graphical. More specifically, it is anticipated that the embodiments may be implemented in a variety of electronic devices or associated with a variety of electronic devices. The variety of electronic devices include (but are not limited to): mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, automobile displays (e.g., odometer displays), navigators, cockpit controllers and/or displays, displays of camera views (e.g., displays of rearview cameras in vehicles), electronic photos, electronic billboards or signs, projectors, building structures, and packaging and aesthetic structures (e.g., displays for displaying an image of a piece of jewelry).

It will be noted that, for convenience of description, other structures of the display panel are not described. In order to implement the necessary functions of the display panel, those skilled in the art can arrange other structures according to specific application scenarios, which is not limited in the embodiments of the present disclosure. The display device has the same beneficial effects as the display panel described above, and details will not be repeated here.

Some embodiments of the present disclosure provide a method for manufacturing a display substrate. For example, the display panel may be the display panel described in any one of the above embodiments, which may be the display panel 100 in FIG. 1.

The method includes the following steps S10 to S40.

In S10, referring to FIG. 1, a substrate 101 is provided. The substrate 101 has a display region AA and a peripheral region S located on at least one side of the display region AA.

For example, the substrate may be a glass plate, a quartz plate, a metal plate, or a resin plate. For example, the material of the substrate may include an organic material; the organic material may include polyimide, polycarbonate, polyacrylate, polyetherimide, polyethersulfone, polyethylene terephthalate, polyethylene naphthalate or other resin materials. For example, the substrate may be composed of a plurality of material layers; for example, the substrate may include a base, and the material of the base may include the above material(s). A buffer layer may be formed on a surface of the base as a transition layer. In this way, it may be possible to prevent harmful substances of the substrate from intruding into the interior of the display panel, and increase the adhesion of layers in the display panel on the substrate. For example, the material of the buffer layer may include silicon oxide, silicon nitride or silicon oxynitride.

In S20, referring to FIG. 1, at least one first signal line 10 and at least one second signal line 20 are formed on the substrate 101 and in the peripheral region S. A first signal line 10 is adjacent to a second signal line 20.

Figure 17A:
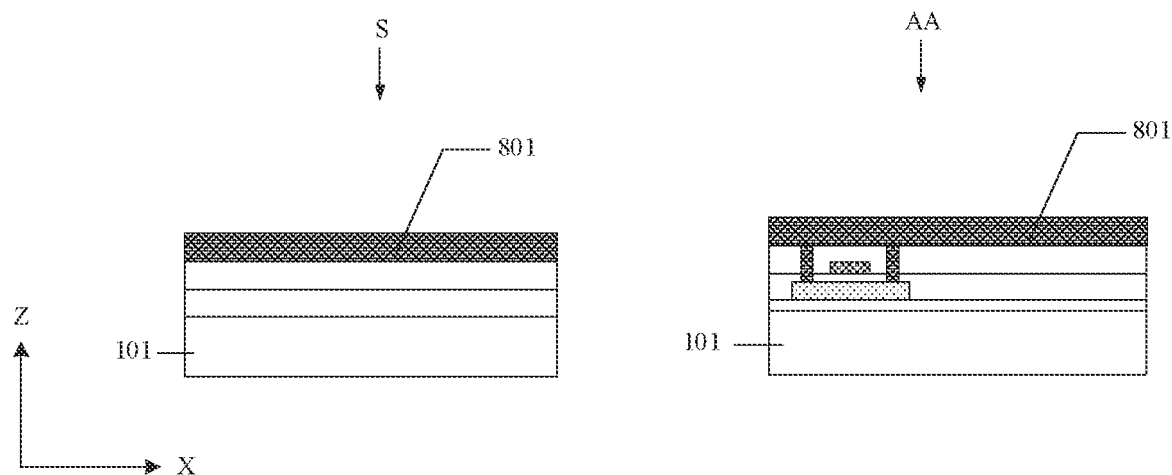
FIG. 17A is diagram showing a process of a method for manufacturing a display panel, in accordance with some embodiments.
Figure 17B:
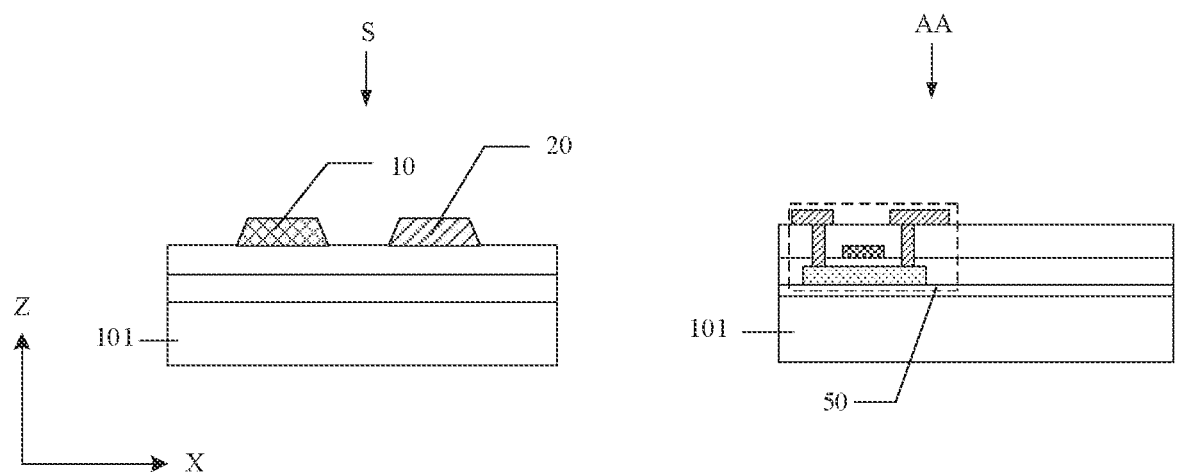
FIG. 17B is a diagram showing another process of a method for manufacturing a display panel, in accordance with some embodiments.

For example, referring to FIGS. 17A and 17B, a conductive film 801 is formed on the substrate 101 and in the peripheral region S, and the conductive film 801 is patterned to obtain the at least one first signal line 10 and the at least one second signal line 20.

For example, the driving circuit(s) and the pixel circuits may be formed on the substrate. The method for forming the driving circuit(s) and the pixel circuits on the substrate is related to the types of the transistors. For example, the transistors may be top-gate TFTs, bottom-gate TFTs, double-gate TFTs or other types of TFTs. As for the processes of forming the driving circuit(s) and the pixel circuits on the substrate, reference may be made to the conventional processes, which will not be repeated here. For example, referring to FIGS. 17A and 17B, the pixel circuits 50 may be formed on the substrate 101 and in the display region AA. For example, the source and drain of each transistor in the pixel circuit may be formed at a same time when the at least one first signal line and the at least one second signal line are formed.

In S30, referring to FIG. 2, an insulating layer 40 is formed. The insulating layer 40 covers the at least one first signal line 10 and the at least one second signal line 20. At least one groove 41 is formed on a surface of the insulating layer 40 away from the substrate 101. An orthogonal projection, on the substrate 101, of a bottom surface F3 of a groove 41 is located between orthogonal projections, on the substrate 101, of the first signal line 10 and the second signal line 20 that are adjacent.

For example, the insulating layer may be made of an organic material, such as epoxy, polyimide, polyamide, acrylic or other suitable materials.

In some examples, forming the insulating layer may include the following steps.

Figure 18A:
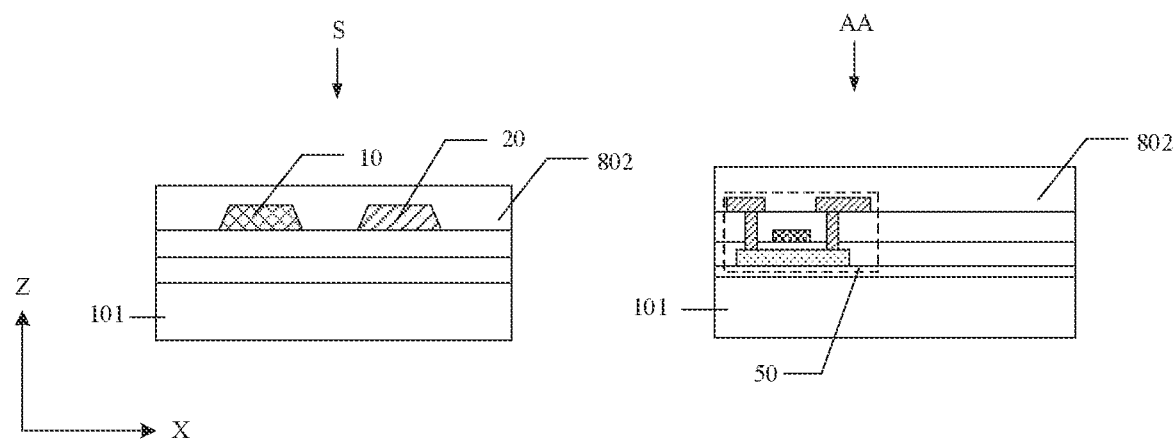
FIG. 18A is a diagram showing yet another process of a method for manufacturing a display panel, in accordance with some embodiments.
Figure 18B:
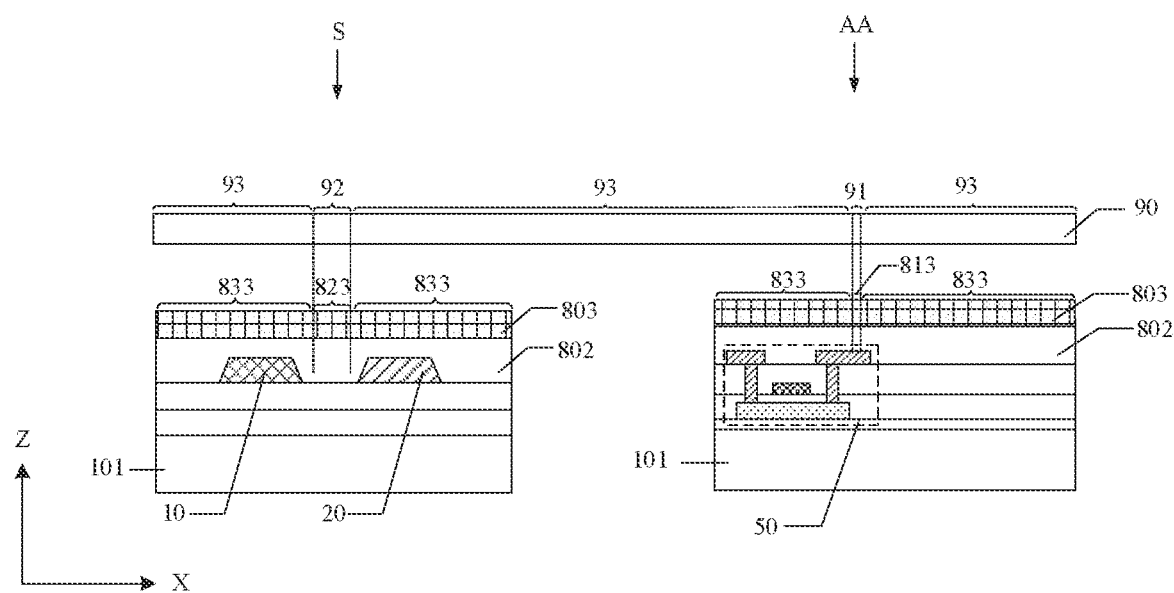
FIG. 18B is a diagram showing yet another process of a method for manufacturing a display panel, in accordance with some embodiments.

Referring to FIG. 18A, an insulating material layer 802 is formed on the substrate 101 on which the at least one first signal line 10 and the at least one second signal line have been formed. For example, an insulating material may be deposited on the substrate 101 on which the at least one first signal line 10 and the at least one second signal line 20 have been formed, so as to obtain the insulating material layer 802. Referring to FIG. 18B, a photoresist layer 803 is formed on the insulating material layer 802. For example, the photoresist layer is made of a photosensitive resin material such as photoresist; for example, the photosensitive resin material is a positive photoresist. Referring to FIG. 18B, the photoresist layer 803 is exposed through a halftone mask 90, and the exposed photoresist layer 803 is developed, so as to obtain photoresist completely-removed portion(s) 813, photoresist partially-retained portion(s) 823, and a photoresist completely-retained portion 833. For example, the photoresist completely-removed portion may correspond to a portion of the insulating material layer for forming a via hole, a photoresist partially-retained portion may correspond to a portion of the insulating material layer for forming a groove, and the photoresist completely-retained portion may correspond to the remaining portion of the insulating material layer.

For example, referring to FIG. 18B, the halftone mask 90 includes a first portion 91, a second portion 92 and a third portion 93. Light transmittances of the first portion 91, the second portion 92 and the third portion 93 are sequentially decreased. For example, the first portion 91 may be an opening. For example, the third portion 93 may be opaque. In this way, by setting the light transmittances of the first portion 91, the second portion 92 and the third portion 93, and controlling an exposure intensity in the exposure process, a portion of the photoresist layer 803 corresponding to the first portion 91 is completely exposed, a portion of the photoresist layer 803 corresponding to the second portion 92 is partially exposed, and a portion of the photoresist layer 803 corresponding to the third portion 93 is not exposed.

Figure 18C:
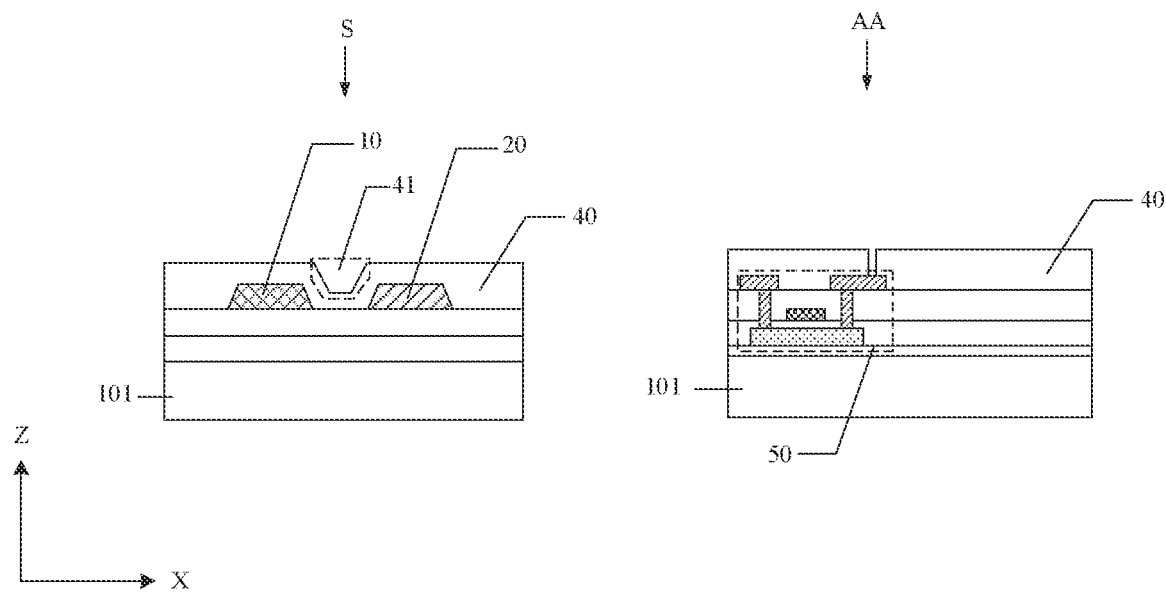
FIG. 18C is a diagram showing yet another process of a method for manufacturing a display panel, in accordance with some embodiments.

Referring to FIGS. 18B and 18C, the insulating material layer 802 is etched, so as to remove the portion of the insulating material layer 802 corresponding to the photoresist completely-removed portion 813. The photoresist partially-retained portion(s) 823 are removed through an ashing process. A respective portion of the insulating material layer 802 corresponding to each of the at least one photoresist partially-retained portion 823 is etched, so as to form the at least one groove 41. The photoresist completely-retained portion 833 is stripped. Therefore, the insulating layer 40 is obtained.

It will be noted that, by using the above steps of forming the insulating layer, the insulating layer with a single-layer structure or a double-layer structure may be obtained. Referring to FIG. 14, the insulating layer 40 with the double-layer structure includes a first insulating layer PLN1 and a second insulating layer PLN2. Referring to FIG. 15, the insulating layer 40 with a single-layer structure includes a first insulating layer PLN1. As for the specific manufacturing process of the insulating layer with the double-layer structure, reference may be made to the above description, which will not be repeated here.

In S40, referring to FIGS. 1 and 2, a shielding signal line 30 is formed, and the shielding signal line 30 covers the at least one groove 41. For example, a conductive material may be deposited on the substrate to obtain a conductive material layer, and the conductive material layer is patterned to obtain the shielding signal line.

Figure 19:
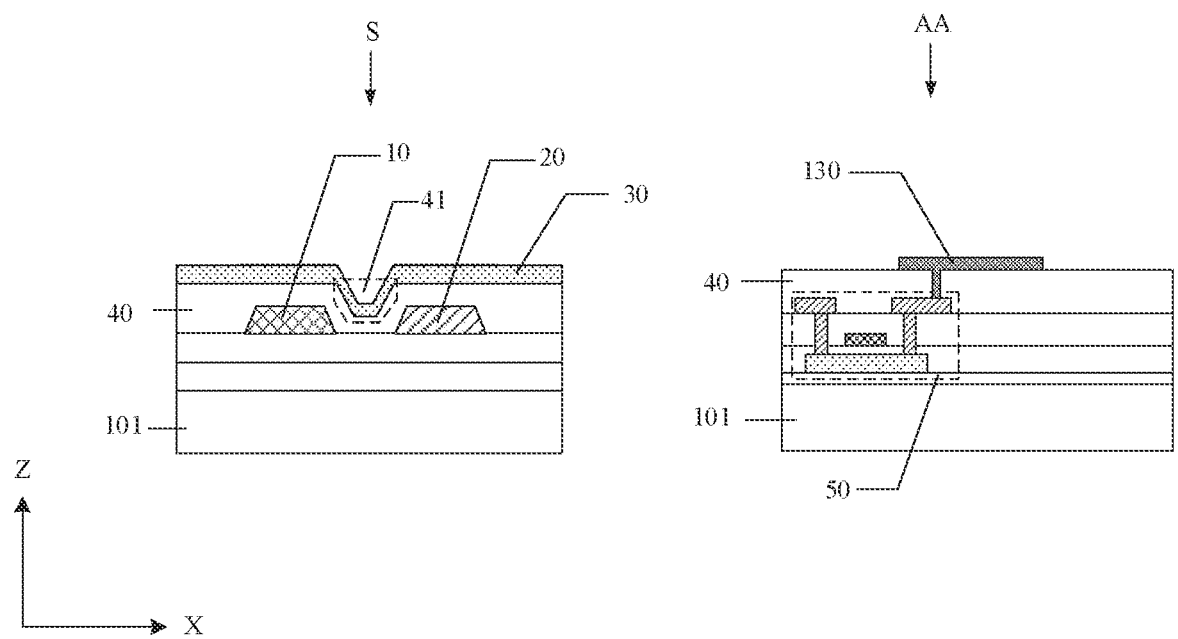
FIG. 19 is a diagram showing yet another process of a method for manufacturing a display panel, in accordance with some embodiments.

For example, referring to FIG. 19, third conductive pattern(s) 130 may be formed on the substrate 101 and in the display region AA at a same time when the shielding signal line 30 is formed on the substrate 101 and in the peripheral region S. A third conductive pattern 130 is coupled to a pixel circuit 50 through a via hole located in the insulating layer 40. For example, the third conductive pattern is coupled to a drain of a driving transistor in the pixel circuit. Referring to FIG. 15, in the process of forming the light-emitting devices 70 on the substrate, a first electrode 71 of a light-emitting device 70 may be coupled to the pixel circuit 50 through the third conductive pattern 130. In this case, the shielding signal line is closer to the substrate than the first electrodes of the light-emitting devices.

For example, referring to FIG. 14, the insulating layer 40 has the double-layer structure, and the insulating layer 40 with the double-layer structure includes the first insulating layer PLN1 and the second insulating layer PLN2. A transparent conductive material layer may be formed on the second insulating layer PLN2, and the transparent conductive material layer is patterned, so that the shielding signal line is obtained, and the first electrodes of the light-emitting devices are obtained at the same time.

It will be noted that, beneficial effects of the method for manufacturing the display panel described above are the same as beneficial effects of the display panel described in the above embodiments, and details will not be repeated here.

It will be noted that, the drawings of the embodiments of the present disclosure merely relate to the structures involved in the embodiments of the present disclosure, and as for other structures, reference may be made to general designs. In the drawings used for the description of the embodiments of the present disclosure, the thickness of layers or sizes of regions may be enlarged or reduced for clarity, that is, the drawings are not drawn to actual scale. The embodiments of the present disclosure and the features in the embodiments may be combined with each other to obtain new embodiments without conflict.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel having a display region and a peripheral region located on at least one side of the display region, the display panel comprising:
    a substrate;
    at least one first signal line disposed on the substrate and located in the peripheral region;
    at least one second signal line disposed on the substrate and located in the peripheral region, wherein the at least one second signal line and the at least one first signal line are arranged in a same layer;
    an insulating layer covering the at least one first signal line and the at least one second signal line, wherein a surface of the insulating layer away from the substrate has at least one groove, and an orthogonal projection, on the substrate, of a bottom surface of a groove of the at least one groove is located between adjacent two edges of orthogonal projections, on the substrate, of a first signal line of the at least one first signal line and a second signal line of the at least one second signal line;
    a shielding signal line covering the at least one groove;
    a plurality of pixel circuits disposed on the substrate and located in the display region; and
    a driving circuit disposed on the substrate and located in the peripheral region; wherein the driving circuit is directly electrically connected to the plurality of pixel circuits, the first signal line and the second signal line; and the driving circuit is configured to provide driving signals to the plurality of pixel circuits in response to a first signal received at the first signal line and a second signal received at the second signal line, so as to drive the plurality of pixel circuits to operate.

2. The display panel according to claim 1, wherein in a direction perpendicular to a plane where the substrate is located, the bottom surface of the groove is closer to the substrate than at least one of a top surface of the first signal line and a top surface of the second signal line.

3. The display panel according to claim 1, wherein the first signal line is adjacent to the second signal line; and
    a width of the bottom surface of the groove is less than or equal to a distance between the adjacent two edges of the orthogonal projections, on the substrate, of the first signal line and the second signal line.

4. The display panel according to claim 1, wherein a width of the bottom surface of the groove is in a range of 2 μm to 10 μm, inclusive.

5. The display panel according to claim 1, wherein the first signal line and the second signal line extends in a same direction; and the groove extends in an extending direction of the first signal line and the second signal line.

6. The display panel according to claim 1, wherein the orthogonal projections, on the substrate, of the first signal line and the second signal line are located within an orthogonal projection, on the substrate, of the shielding signal line.

7. The display panel according to claim 1, wherein the shielding signal line is located in the peripheral region, and surrounds the display region.

8. The display panel according to claim 1, wherein the first signal line is configured to transmit the first signal; the second signal line is configured to transmit the second signal; the first signal and the second signal are pulse signals, and the first signal and the second signal are different; and
the shielding signal line is configured to transmit a direct current signal.

9. The display panel according to claim 8, wherein the first signal and the second signal have a same pulse cycle; and the first signal and the second signal have a phase difference.

10. The display panel according to claim 9, wherein the pulse cycle is in a range of 4 µs to 100 µs, inclusive.

11. The display panel according to claim 1, further comprising:
a plurality of light-emitting devices disposed on the substrate and located in the display region, wherein
each light-emitting device of the plurality of light-emitting devices includes a first electrode and a second electrode, the first electrode is closer to the substrate than the second electrode, and the second electrode is coupled to the shielding signal line.

12. The display panel according to claim 11, wherein the first electrode of the light-emitting device and the shielding signal line are arranged in a same layer; and
the insulating layer has a double-layer structure.

13. The display panel according to claim 11, wherein the first electrode of the light-emitting device is farther away from the substrate than the shielding signal line; and
the insulating layer has a single-layer structure.

14. A display device, comprising:
the display panel according to claim 1; and
a control chip coupled to the display panel, the control chip being configured to provide signals for the display panel.

15. A method for manufacturing a display panel, comprising:
providing a substrate, wherein the substrate has a display region and a peripheral region located on at least one side of the display region;
forming at least one first signal line and at least one second signal line on the substrate and in the peripheral region;
forming an insulating layer, wherein the insulating layer covers the at least one first signal line and the at least one second signal line, a surface of the insulating layer away from the substrate has at least one groove, and an orthogonal projection, on the substrate, of a bottom surface of a groove of the at least one groove is located between adjacent two edges of orthogonal projections, on the substrate, of a first signal line of the at least one first signal line and a second signal line of the at least one second signal line; and
forming a shielding signal line, wherein the shielding signal line covers the at least one groove;
the method further comprising:
forming a plurality of pixel circuits on the substrate in the display region; and
forming a driving circuit on the substrate and in the peripheral region, wherein the driving circuit is directly electrically connected to the plurality of pixel circuits, the first signal line and the second signal line; and the driving circuit is configured to provide driving signals to the plurality of pixel circuits in response to a first signal received at the first signal line and a second signal received at the second signal line, so as to drive the plurality of pixel circuits to operate.

16. The method according to claim 15, wherein forming the insulating layer includes:
forming an insulating material layer on the substrate on which the at least one first signal line and the at least one second signal line have been formed;
forming a photoresist layer on the insulating material layer;
exposing the photoresist layer through a halftone mask;
developing the exposed photoresist layer, so as to obtain a photoresist completely-removed portion, at least one photoresist partially-retained portion and a photoresist completely-retained portion;
etching the insulating material layer, so as to remove a portion of the insulating material layer corresponding to the photoresist completely-removed portion;
removing the at least one photoresist partially-retained portion through an ashing process;
etching a respective portion of the insulating material layer corresponding to each of the at least one photoresist partially-retained portion, so as to obtain the at least one groove; and
stripping the photoresist completely-retained portion, so as to obtain the insulating layer.

17. The display panel according to claim 2, wherein the first signal line is adjacent to the second signal line; and
a width of the bottom surface of the groove is less than or equal to a distance between the adjacent two edges of the orthogonal projections, on the substrate, of the first signal line and the second signal line.

* * * * *